United States Patent [19]

Akioka et al.

[11] Patent Number: 5,680,066
[45] Date of Patent: Oct. 21, 1997

[54] SIGNAL TRANSITION DETECTOR CIRCUIT

[75] Inventors: Takashi Akioka; Masahiro Iwamura; Atsushi Hiraishi; Yuji Yokoyama; Nozomu Matsuzaki; Tatsumi Yamauchi, all of Hitachi; Yutaka Kobayashi, Katsuta; Nobuyuki Gotou, Takasaki; Akira Ide, Takasaki; Masahiro Yamamura, Takasaki; Hideaki Uchida, Takasaki, all of Japan

[73] Assignee: Hitachi, Ltd., Tokyo, Japan

[21] Appl. No.: 182,699

[22] Filed: Jan. 13, 1994

Related U.S. Application Data

[63] Continuation of Ser. No. 820,084, Jan. 13, 1992, abandoned, which is a continuation of Ser. No. 490,070, Mar. 7, 1990, abandoned.

[30] Foreign Application Priority Data

| Mar. 9, 1989 | [JP] | Japan | 1-57066 |
| Mar. 10, 1989 | [JP] | Japan | 1-58453 |
| Mar. 13, 1989 | [JP] | Japan | 1-59934 |
| Mar. 13, 1989 | [JP] | Japan | 1-60094 |
| Mar. 17, 1989 | [JP] | Japan | 1-63749 |

[51] Int. Cl.$^6$ .................. H03K 5/153; H03K 3/033; G01R 29/02
[52] U.S. Cl. .................. 327/78; 327/14; 327/103; 327/227; 365/233.5
[58] Field of Search .................. 307/261, 362, 307/231, 517, 273, 299.1, 299.2, 265; 328/13, 61, 132; 365/233.5; 327/14, 15, 24, 50, 51, 77, 78, 80, 81, 82, 88, 89, 103, 334, 355, 480, 164, 165, 227, 184, 291, 479, 204, 577

[56] References Cited

U.S. PATENT DOCUMENTS

| 4,893,282 | 1/1990 | Wada et al. | 365/233.5 |
| 4,982,117 | 1/1991 | Matsuzaki et al. | 326/64 |
| 5,008,858 | 4/1991 | Ikeda | 365/233.5 |
| 5,200,926 | 4/1993 | Iwahashi et al. | 365/233.5 |

FOREIGN PATENT DOCUMENTS

| 0045717 | 3/1982 | Japan | 307/261 |
| 359151523 | 8/1984 | Japan | 327/24 |
| 2087711 | 3/1990 | Japan | 327/14 |

OTHER PUBLICATIONS

Macleod et al., "Generating Narrow Pulses with CMOS Logic," Electronic Product Design, Oct. 1980, p. 21.

*Primary Examiner*—Toan Tran
*Attorney, Agent, or Firm*—Antonelli, Terry, Stout & Kraus

[57] ABSTRACT

A semiconductor device which includes at least one of (1) an input buffer circuit formed of an input level converter and a non-inverting buffer circuit and an inverting buffer circuit each including BiCMOS circuitry which effects high-speed operation; (2) a decoder circuit formed of plural logic gates each of which is composed of the combination of MOS and bipolar circuitry; (3) a sense amplifier circuit including a multiemitter transistor; (4) a signal or address transition detector circuit which includes input circuits each receiving, for example, an address signal of a voltage amplitude and outputting a current amplitude signal in response to a change in level of the address signal, and a detector circuit connected thereto which has a cascode amplifier arranged such that it receives current amplitude signals at an input thereof and in which the cascode amplifier input is maintained at a substantially constant voltage, in which the detection circuit detects a transition of one or more of the current amplitude signals and, in response thereto, generates an ATD signal of a voltage amplitude; and (5) an output buffer circuit, in which the decoder, sense amplifier and output buffer of the device such as for a memory are controlled in accordance with signals from a clock generator, which is responsive to the ATD signal.

51 Claims, 26 Drawing Sheets

PRIOR ART
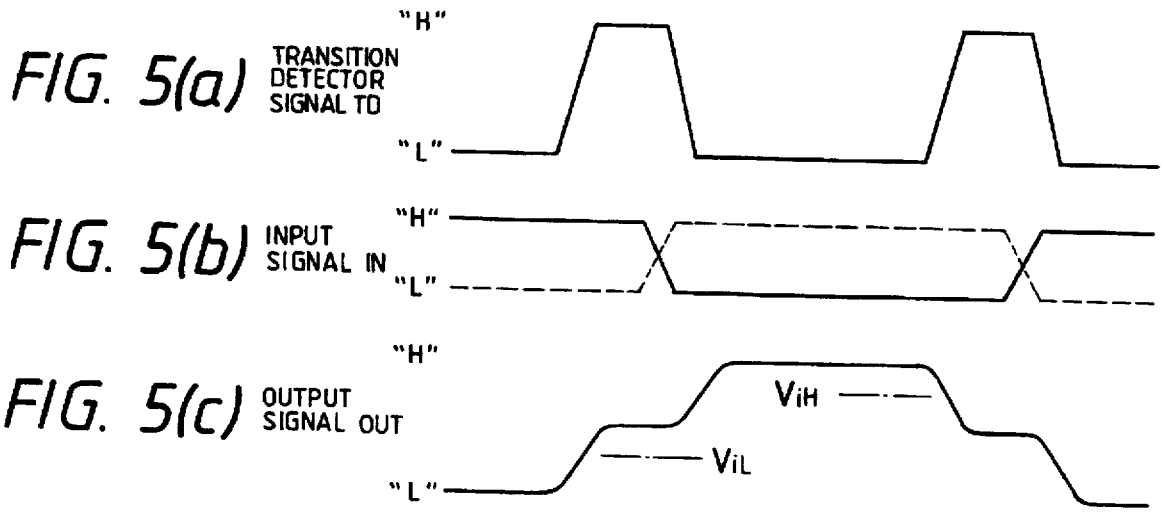
FIG. 5(a) TRANSITION DETECTOR SIGNAL TD
FIG. 5(b) INPUT SIGNAL IN
FIG. 5(c) OUTPUT SIGNAL OUT
FIG. 6 PRIOR ART
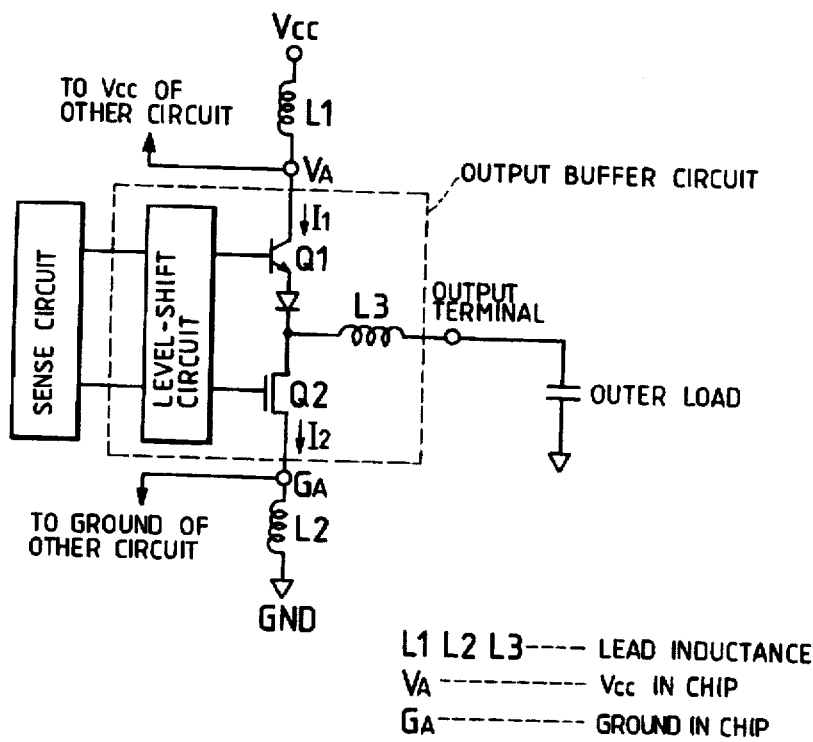
L1 L2 L3 ---- LEAD INDUCTANCE
$V_A$ -------- Vcc IN CHIP
$G_A$ -------- GROUND IN CHIP

PRIOR ART
FIG. 7(a) OUTPUT VOLTAGE 
FIG. 7(b) CURRENT $I_1$, $I_2$ 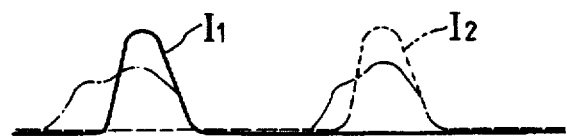
FIG. 7(c) VOLTAGE $V_A$ 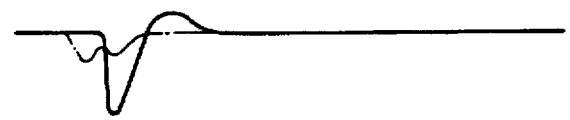
FIG. 7(d) VOLTAGE $G_A$ 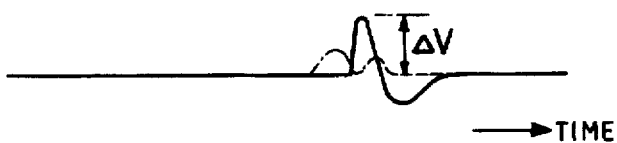
→TIME
$I_1$ --- CURRENT THROUGH OUTPUT BIPOLAR
$I_2$ --- CURRENT THROUGH OUTPUT NMOS
$V_A$ --- Vcc VOLTAGE IN LSI CHIP
$G_A$ --- GROUND VOLTAGE IN LSI CHIP
FIG. 8
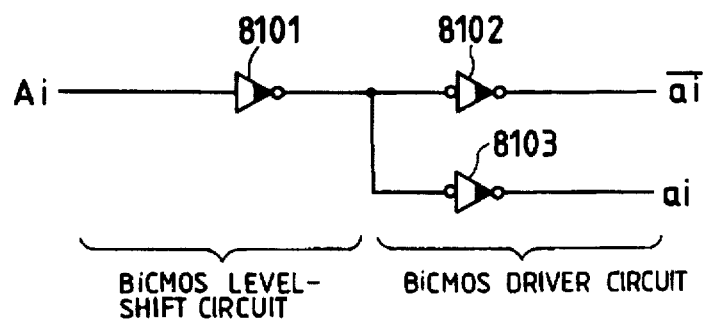

BiCMOS LEVEL-SHIFT CIRCUIT
BiCMOS DRIVER CIRCUIT

BiCMOS LEVEL-SHIFT CIRCUIT    BiCMOS DRIVER CIRCUIT

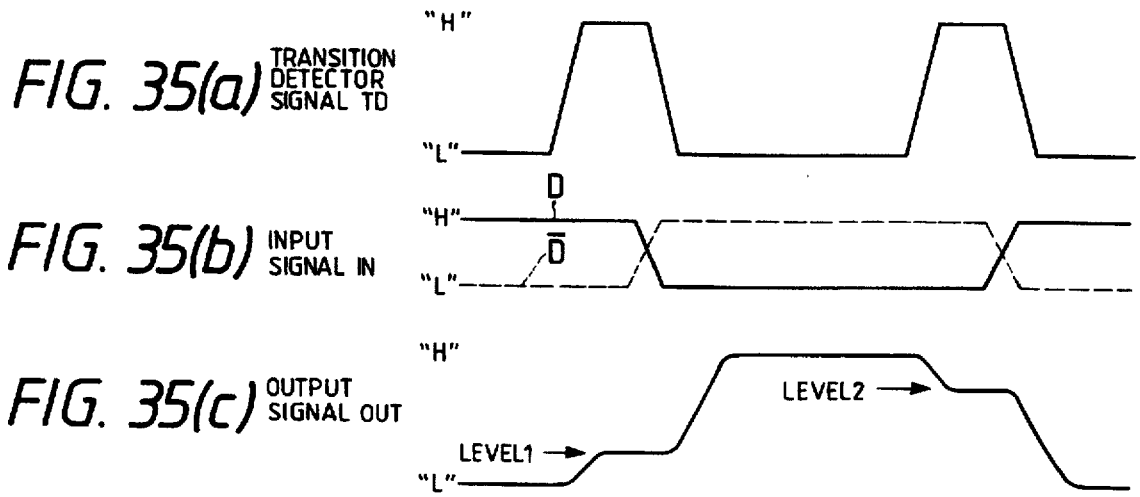
FIG. 35(a) TRANSITION DETECTOR SIGNAL TD
FIG. 35(b) INPUT SIGNAL IN
FIG. 35(c) OUTPUT SIGNAL OUT
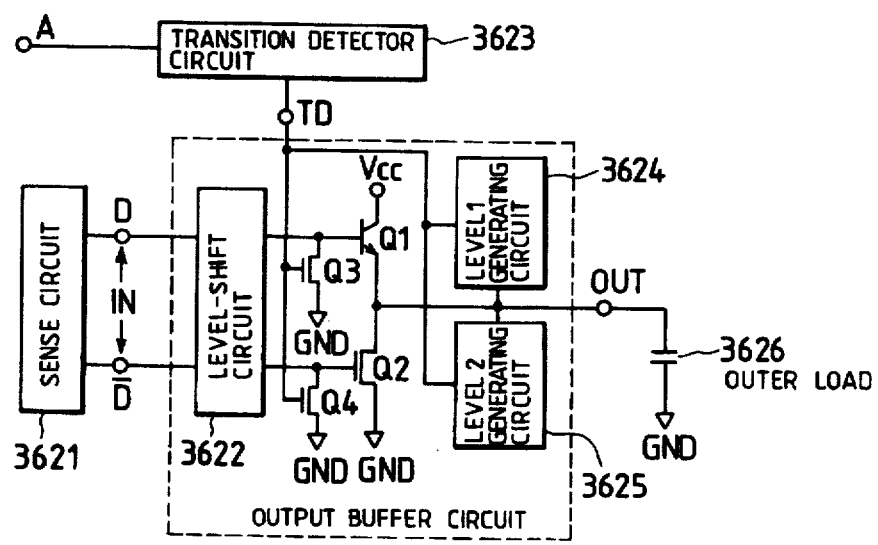
FIG. 36

Q71 ------ N CHANNEL MOS
Q72 ------ NPN BIPOLAR TRANSISTOR
D71 D72 ---- DIODE

SIGNAL TRANSITION DETECTOR CIRCUIT

This is a continuation of application Ser. No. 820,084, filed Jan. 13, 1992, abandoned, which is a continuation of Ser. No. 490,070, filed Mar. 7, 1990, now abandoned.

BACKGROUND OF THE INVENTION

The present invention relates to a semiconductor device and in particular relates to a semiconductor device which enables a high speed operation.

Examples of semiconductor devices which enable a high speed operation are memory devices such as a SRAM and a DRAM or arithmetic units such as a microcomputer and a microprocessor.

The semiconductor device has several internal circuits such that in order to enable a high speed operation thereof, the respective internal circuits are required to be operable at high speed.

Examples of the internal circuits are input buffer circuits, decoder circuits, memory cells, sense amplifiers, signal change (or transition) detection circuits (or ATD circuits), amplifiers, output buffer circuits and the like.

Generally, an input buffer circuit which generates two output signals that are mutually in a complementary relation to one input signal is constituted of an input level converter circuit section and a driver circuit section which responds to the output of the input level converter circuit section. Further, the driver circuit section is constituted of a non-reversing buffer circuit which outputs a non-reversing signal corresponding to the output of the input level converter circuit section, and a reversing buffer circuit parallel thereto which outputs a reversing signal.

FIG. 1 shows such an input buffer circuit where the output of an inverter 201, to which an input signal Ai is applied, is transformed to an output signal $\overline{ai}$ through inverters 202 and 203, and is also transformed to an output signal ai through an inverter 204.

In such an input buffer circuit, in the case where the input signal Ai is "Low" level, the output signal ai becomes "Low" level and the output signal $\overline{ai}$ becomes 'High' level.

However, as shown in FIG. 1, the driver circuit that outputs the output signal $\overline{ai}$ is constructed by connecting two inverters 202 and 203 in cascade, and includes one more inverter stage than a driver circuit that outputs the output signal ai.

Therefore, the delay time incurred for effecting an input signal to output signal transfer, such as with respect to achieving the output signal $\overline{ai}$, is greater by the gate delay of one additional inverter stage than that of the output signal ai. Therefore, when considering a buffer circuit built into a memory system, if there is a delay time difference between the inverted signal and non-inverted signal, the decoder circuit connected in a later stage of the input buffer circuit operates by the late signal, which becomes a great hindrance to a high-speed input buffer circuit. Also, the delay time difference, may generate a hazard in the decoder circuit and become an adverse effect on the circuit operation.

Also, as in conventional ones, the level converter part of an input buffer circuit that uses only CMOS inverters is provided in two stages in which there is one more stage than that in the case shown in FIG. 1. This is because the logical threshold voltage $V_{VTH}$ of the first stage CMOS inverter in the level converter part must be set to the mean amplitude of the input signal (in normal operation, 'Low': 0 [V], 'High': 3 [V]). In other words, by determining the gate width or gate length of the PMOS and NMOS transistors of the CMOS inverter to obtain such a $V_{LTH}$, the output signal of the CMOS inverter becomes excessively faster in the case where it changes from 'High' to 'Low' than in the case where it changes from 'Low' to 'High'. This difference associated with the switching speed can be a cause of the hazard in the decoder circuit. Because of this, normally, the level converter circuit, in order to eliminate the difference in the time changing from 'Low' to 'High' and the time changing from 'High' to 'Low', adds one more inverter circuit to thereby effect a two stage construction.

Therefore, there has also been expectations for a high-speed level inverter part.

Further, the decoder circuit is formerly known as one constituted of logical gates in three stages or four stages. (Japanese Patent Laid-Open No. 60-170090 (1985))

FIG. 2 is a block diagram of an example of a prior decoder circuit. According to this diagram, the f.0 and the numerical value mentioned in each gate, is the fan-out number of the corresponding gate.

However, when a decoder circuit is composed with three stage or four stage logical gates as above, a great amount of time for the signal transmission from the input to the output is needed. As a result, a high speed operation of the semiconductor memory apparatus, when viewed as a whole, is hindered. (For example, in the construction of FIG. 2, a delay time of about 2.4 nsec is needed from the primary stage input to the final output.)

Therefore, various measures for the stage reductions of the logical gates were tried, but by reducing the stages, the fan-out for each gate increases, and as a result, the load capacity for each gate becomes greater. Such an increase in the load capacity presents a problem of causing the increase of the delay time instead.

A further conventional device is illustrated in FIG. 3.

The same drawing illustrates a part of the circuit of the device, including the connection from a memory cell to a sense amplifier, in the example disclosed in Japanese Patent Application Laid-Open No. 60-132416 (1985).

In the following explanation, a bipolar transistor is called a transistor and a MOSFET a MOS.

Symbols B1 and B2 respectively show an example of a data line block in a memory cell array. Among a plurality of memory cell array arranged in matrix into X direction and Y direction, by inputting signals, for example, to a signal line X1 and signal lines Y1, Y2, . . . , memory cells to be accessed are selected.

Symbols DL1~DL4 represent data lines, symbols CELL1 and CELL2 represent memory cells each of which has a latch function, symbols M5, M6, M7 and M8 represent transfer MOS which decide whether memory cell information is to be transferred to data lines corresponding thereto, and symbols M9~M12 represent transfer MOS which decides whether data line information corresponding thereto is to be transferred to common data lines CD1, and CD2.

B3 is a presensing block which converts a differential voltage input signal from the common data lines into a differential current signal. Symbols Q1 and Q2, each is a transistor for level shifting, symbols D1 and D2, each is a diode, symbols M13 and M15, each is a MOS. In this presensing block, such operation is effected that through transistors Q3 and Q4 and MOS M14, constituting a differential amplifier, the differential voltage inputted to the bases of Q3 and Q4 is converted into a current signal and is transferred to common collector lines CC1 and CC2.

Usually a plurality of presensing blocks B4 similar to B3 are connected to the same pair of common collector lines, selection of a signal among these is carried out by selecting signals inputted to terminals S1, S2, ...

A block B5 is a circuit which converts a current signal inputted from the common collector lines CC1 and CC2 into a voltage signal and outputs the same to terminals O1 and O2. Resistor elements R1 and R2, transistors Q7 and Q8, a diode D3 and MOSs M19~M21 constitute a cascode amplifier, and the differential current input from CC1 and CC2 is outputted between collectors of Q7 and Q8 as differential voltage. Transistors Q10 and Q11, diodes D4 and D5 and MOSs M22 and M23 constitute a level shifting circuit, and convert into a signal level suitable for the input to a next stage differential amplifier composed of resistor elements R3 and R4, transistors Q12 and Q13 and MOS M24.

In general, for transmitting an electrical signal at high speed, it is important to lower signal amplitude in a signal passage and reduce both the parasitic capacitance and the parasitic resistance in this passage. For example, in the conventional circuit of FIG. 3, when memory capacity is required to be increased, the capacitance and resistance of the above common data lines and common collector lines inevitably become large, so that concurrent realization of both memory capacity increase and high speed operation of the memory device become difficult.

Further, in a digital memory apparatus which introduces the so-called inner synchronizing method, the change in the address signal is detected and the reference signal within the LSI is produced. The ATD (Address Transition Detection) circuit is what accomplishes this task.

FIG. 4 shows the construction of the main parts of a prior ATD circuit.

The number of address signal lines increase and decrease according to the memory capacity and its bit construction. The ATD circuit needs to detect the generation of the change of the signal of the address signal line, when any signals change. Therefore, voltage pulse generators 22-1~22-n which receive the corresponding outputs of input buffers 21-1~21-n and generate, while responding to the changes, voltage pulses 23-1~23-n, respectively, are provided to each address signal $A_0$~An. Each voltage pulse generator circuit 22 is respectively formed of inverters 28-1~28-3 and the FETs 29-1~29-5. FETs 29-1 and 29-2 carry out the detection of the leading edge, and FETs 29-3 and 29-4 carry out the detection of the trailing edge. This detected output appears at the node of the FET 29-5 as a voltage pulse. The voltage pulse output of each voltage pulse generator circuit 22 is supplied to an OR circuit 24 through the inverter 28-3. The OR circuit 24, by means of FETs 26-1~26-n and a FET 27, takes the logical sum of these voltage pulse outputs, and outputs this logical sum signal as a reference signal 25 through an inverter 20.

Further, an example of this type of ATD circuit is indicated in Japanese Patent Laid-Open No. 59-54094 (1984).

In the prior ATD circuit, the transmission of the signals is carried out by the voltage amplitude or the change (High, Low) of the voltage level. Meanwhile, because the drain of each FET 26-1~26-n of the OR circuit 24 is in a common connection to the FET, the load of each FET 26 becomes heavy, and because of charge and discharge time requirements of this load, the ability to change the speed, i.e. to increase the speed, of the output voltage of the OR circuit 24 is limited.

Thus, in the prior ATD circuits, there was a limit to a high operating speed, which was a drawback in attempts at reducing the access time of the digital memory apparatus.

Still further, as a prior output buffer circuit of semiconductor apparatuses such as a semiconductor memory and a microprocessor, that handles digital signals, which shortens the access time, and increases the processing speed, Japanese Patent Application Laid-Open No. 59-181828 (1984) is known. This publication features maintaining the output at an intermediate level between "L" level and "H" level preceding the application of the input signal to the output buffer circuit. Also, the scheme disclosed therein reduces noise.

In other words, the principle construction of an output buffer circuit is shown as an equivalent circuit in FIG. 6.

The same figure is assumed to be incorporated within a common LSI chip and contained in a package, and the symbols L1~L3 are lead inductances which are added in the case where the LSI is loaded in a package. The multiple number of the output buffer circuits corresponding to the number of outputs, one of which is surrounded by the dotted line, in cases such as a multiple bit construction, are connected in parallel. In the output buffer circuit when the output changes as "L"→"H"→"L", the waveforms of the current ($I_1$) that flows in an output bipolar transistor $Q_1$ and the current ($I_2$) that flows in an output NMOS transistor $Q_2$, and the Vcc voltage ($V_A$) within the LSI chip and the grounded voltage ($G_A$), are shown by the solid lines in FIGS. 7(a)–7(d), respectively. As is clear from FIG. 6 and FIGS. 7(a)–7(d), it is required to charge and discharge the load capacitance in raising and lowering the output voltage, respectively; therefore, $I_1$ and $I_2$ transiently show a large peak (FIG. 7[b]). At this time, a voltage (V-dI/dt), which is proportional to the time differentiation of the current, is generated at both ends of the lead inductances of L1 and L2. Therefore, the Vcc potential ($V_A$) within the LSI chip and the grounding potential ($G_L$) fluctuates transiently (FIGS. 7[c], and 7[d]), which is a similar phenomenon to the generation of noise ΔV on each potential.

Hence, by forming an output voltage as shown by the alternate long and short dashed line in FIG. 7(a) by means of the art stated in Japanese Patent Application Laid-Open No. 59-181828 (1984), the charging and discharging of the load capacitance is divided into two times, and the peak magnitude of the current is lowered (the alternate long and short dashed line of FIG. 7[b]), as a result, reduction of noise caused by L-dI/dt is achieved (the alternate long and short dashed lines of FIGS. 7[c] and [d]).

Further, FIGS. 5(a) through 5(c) are the operating waveforms by the art of the above application, and by applying the transition detector signal (FIG. 5[a]) to the input signal shown in FIG. 5(b), an output signal as shown in FIG. 5(c), which is the same signal shown by the alternate long and short dashed line in FIG. 7(a), is obtained.

However, because the output assumes the mean level of the "L" level and "H" level preceding application of the input signal to the output buffer circuit, there was a problem in that the entire mean level signal becomes an input signal to other semiconductor integrated circuits.

In other words, the other semiconductor integrated circuit concerned, assumes the state to accept only "H" level or "L" level, but because the mean level signal is too close to the threshold voltage ($V_{th}$) of the other semiconductor integrated circuit concerned, an adverse influence such as oscillating the input buffer circuit of the other semiconductor integrated circuit occurs.

SUMMARY OF THE INVENTION

In consideration of the aforementioned problems, applicants have schemed the present invention which is inclusive of the following main objectives:

(1) To provide a semiconductor device which achieves a high speed operation;

(2) To provide a semiconductor device including internal circuits having a high speed operation; more specifically, (3) To provide a semiconductor device having an input buffer circuit which substantially eliminates the delay time difference that is induced between the inverted signal and the non-inverted signal and which increases the operating speed.

(4) To provide a semiconductor device having an input buffer circuit with an increased operating speed and as an input buffer circuit which increases the effective operating speed of an entire circuit;

(5) To provide a decoder circuit that increases the operating speed;

(6) To achieve high speed operation of a semiconductor memory device;

(7) To provide a high speed signal change (transition) detector circuit which is suitable to be applied to a digital memory apparatus;

(8) To provide a high speed memory apparatus which utilizes the above signal change detector circuit;

(9) To provide a voltage-current converter circuit which is suitable to be applied to the above signal change detector circuit;

(10) To provide a pulse stretching circuit which is suitable to be applied to the above digital memory apparatus;

(11) To provide an output buffer circuit which has high speed operation without doubt, and a low noise as well as exerts no adverse influence to the other semiconductor integrated circuit.

For achieving the above objects, the characteristics of the semiconductor device according to the present invention include at least one of the following circuits.

(a) An input buffer circuit comprising an input level converter circuit which generates two output signals being mutually in a complementary relation to one input signal, and a single stage non-inverting buffer circuit, which responds to the output of the input level converter circuit, and a single stage inverting buffer circuit which is disposed in parallel to the non-inverting buffer circuit, and responds to the output of said input level converter circuit, and both of said non-inverting buffer circuit and said inverting buffer circuit are composed of Bi-CMOS transistors, of which the input part is formed of a MOS transistor, and the output part is formed of a bipolar transistor;

(b) A decoder circuit formed by using a plurality of logical gates each of which is composed of a combined MOS and bipolar circuit, wherein the input part is formed of a MOS transistor and the output part is formed of a bipolar transistor, and constituted in two stages;

(c) A sense amplifier circuit including a multi emitter transistor;

(d) A voltage-current converter circuit which converts the voltage change of an input signal to a pulse current, and cascode amplifier which receives said pulse current and carries out a current-voltage conversion;

(e) An output buffer circuit which includes an input terminal being inputted with signals from the internal part of a semiconductor integrated circuit, and an output terminal outputting signals to the outer circuit of said semiconductor integrated circuit, and temporarily maintains the output potential at an intermediate electric potential between the source and the ground potentials on the basis of the outputted transition detector signals, which precedes the change of the input that is to be propagated as the output, and further includes a circuit that sets the intermediate electric potential to $V_1$ when the electric potential of the output terminal of the data immediately before is "Low", and sets the intermediate electric potential to $V_2$ when the electric potential of the output terminal of the data immediately before is "High", in which $V_1$ and $V_2$ have the relationship of $V_1 < V_2$.

Hereinbelow, the characteristics by the present invention are explained in more detail.

(1) The present invention is characterized by being provided with an input buffer circuit which generates two output signals that are mutually in a complementary relation to one input signal, and the input buffer circuit includes an input level converter circuit, a signal stage non-inverting buffer circuit that responds to the output of the input level converter circuit, and a single stage inverting buffer circuit which is disposed in parallel to the non-inverting buffer circuit, and responds to the output of the input level converter circuit, and both of the non-inverting buffer circuit and the inverting buffer circuit are composed of Bi-CMOS transistors, of which the input part is formed of a MOS transistor, and the output part is formed of a bipolar transistor.

(2) Further, in the construction described above, the input buffer circuit is composed of a Bi-CMOS transistor of which the input part is formed of a MOS transistor, and the output part is formed of a bipolar transistor.

In the semiconductor integrated circuit thus constructed, because the output from the input level converter circuit is applied to the non-inverting buffer circuit and the inverting buffer circuit both of which are constructed in a single stage, there will be no time lag in the output from each buffer.

Further, by using a combined circuit of a MOS transistor and bipolar transistor for the level converter circuit, the difference in changing (transition) time of the output potential that resulted in the single stage CMOS inverter, when it changes from 'Low' to 'High' and when it changes from 'High' to 'Low' can be eliminated. Therefore, in contradistinction to that using only CMOS inverter circuits, in which the level converter circuit has a two stage type construction, by using the combined circuit of the MOS transistor and the bipolar transistor, however, the construction can be made in a single stage, and the delay time of the input buffer circuit can be decreased. Still further, compared to the CMOS inverter, the increase of the delay time corresponding to the increase of the load capacitance is small in the combined circuit of the MOS transistor and the bipolar transistor. Therefore, by using the combined circuit of the MOS transistor and the bipolar transistor in the level converter circuit, a MOS transistor with a large gate capacitance for a driver circuit that responds to the output of the level converter circuit can be used, and thus a high-speed driver circuit is obtained.

(3) The present invention is formed by using a plurality of logical gates formed of a combined MOS and bipolar circuit, and constituted in two stages of which the input part is composed of a MOS transistor and the output part of a bipolar transistor.

Also, such a decoder circuit is to be incorporated to a decoder circuit part of a memory apparatus with a relatively large memory capacity.

In the decoder circuit thus constructed, because the logical gate, which is a part of the construction, uses a MOS transistor in its input part, the input capacity can be made small. Also, a large load driving force is to be obtained from the small capacity MOS transistor with an inevitable small load driving force, by means of the bipolar transistor which is set in the output part. Because of this, the logical gate can be made in a two stage construction, and in such a case, because the input load capacitance is small even if the fan-out increases, the load capacitance that is calculated from the following formula can be made small.

total load capacitance of the next stage gate inputs =fan-out×input load capacitance for every gate of the next stage And because the operating time of the logical gate depends on the total load capacitance of the next stage gate inputs, the operating speed can be increased.

(4) In a semiconductor memory device comprising a memory cell array;

an address decoder which provides address information to the memory cell array;

an input buffer which provides an address signal to the address decoder;

a sense amplifier which amplifies a memory cell signal based on the address information from the address decoder;

and an output buffer to which the output of the sense amplifier is inputted, the sense amplifier includes a multi emitter transistor.

(5) A semiconductor device comprises a plurality of differential voltage-differential current converting means, the output of one of the differential voltage-differential current converting means is connected to one pair common data bus lines and more than one of the differential voltage-differential current converting means are connected to the one pair of common data bus lines; and current-voltage converting means which converts the differential current signal of the one pair of common data bus lines into a voltage signal, more than two pairs of the common data bus lines are connected to the current-voltage converting means.

The reasons why the parasitic capacitance and the parasitic resistance of the conventional common data bus lines i.e., the common collector lines, were large include the following. Since the collector terminal is commonly used which, generally, has the largest parasitic capacitance between the substrate among the terminals of a planar transistor for an integrated circuit, the parasitic capacitance associated with the common data bus lines therefor is rendered large.

Accordingly, for decreasing the capacitance, it is necessary to reduce the number of presensing blocks which are connected to a pair of common collector lines. However, in the conventional art, the number of common collector lines for every one bit data was one, so that measures such as the increase of lines associated with a data multiplexing scheme including an increase of the data line number connected to every one common data line had to be taken into consideration. Such measures, on the other hand, caused the increase of delay time in the common data line. Although the delay time could not be shortened by providing a plurality of common collector lines for every one bit data, the parasitic capacitance of the respective common collector lines is reduced and the high speed operation is enabled.

(6) The signal change detector circuit according to the present invention is provided with a voltage-current converter circuit which converts the voltage change of the input signal to a pulse current, and a cascode amplifier which receives the pulse current and carries out a current-voltage conversion.

(7) The signal change converter circuit according to another aspect of the present invention is provided with n current-voltage converter circuits which convert the voltage changes of the input signals to pulse currents for each of $n(\leq 2)$ input signals, and a cascode amplifier which converts current signals to voltage signals and the outputs of the n current-voltage signals are connected in wired logic, and applied to the cascode amplifier.

(8) Another signal change detector circuit according to the present invention is provided with n current-voltage converter circuits which convert the voltage changes of the input signals to pulse signals for each of $n(\leq 2)$ input signals, and a $k(\geq n)$ input cascode amplifier which converts current signals to voltage signals, and the n current-voltage converter circuits are divided into k sets, and for each set, the outputs are connected in wired logic and applied to the k input cascode amplifier.

(9) The signal change (transition) detector circuit according to still another aspect is provided with n current-voltage converter circuits which convert the voltage changes of the input signals to pulse signals for each of $n(\leq 2)$ input signals, and an amplifier with a grounded base type multi-emitter bipolar transistor which has $k(\geq n)$ emitters, as the input stage, and the n current-voltage converter circuit are divided into k sets, and for each set, the outputs are connected in wired logic and further connected to the k emitters.

(10) The sets of the said current-voltage converter circuits may be allowed to include only one current-voltage converter circuit.

(11) It is preferable to construct the above voltage-current converter circuit with a MOSFET, and construct the input stage of the current-voltage converter circuit with a grounded base type bipolar transistor wherein the emitter takes the input.

(12) It is also possible to construct the voltage-current converter circuit with a MOSFET, and construct the input stage of the current-voltage converter circuit with a grounded gate type MOSFET wherein the source takes the input.

(13) The voltage-current converter circuit according to the present invention, which converts the voltage change of the input signal to a pulse current, has a current limiter circuit which suppresses the peak value of the generated pulse current.

(14) The voltage-current converter circuit according to another aspect of the present invention, which converts the voltage changes of the input signal to pulse currents, is provided with at least one FET of which the drain-source path is connected between ground potential and the current output terminal, a control circuit which applies a control signal to the gates for conducting every FET for a predetermined time during the change of the input signal, and a current limiting FET which has a reference voltage applied to the gate thereof, and which has the drain-source thereof connected in series to the drain-source path of the above referred-to at least one FET.

(15) The digital memory apparatus according to the present invention is provided with any one of the above signal change detector circuits, and a synchronizing signal generator circuit which generates an internal synchronizing signal in response to the detected output of the signal change detector circuit.

(16) The digital memory apparatus according to another aspect of the present invention is provided with a first converter circuit which converts the change of the address signal to a pulse current, an addition means which adds the current pulses of the converter circuit to the node of an approximately constant electric potential, a second conversion means which converts the current pulses added by the addition means to a voltage change, and a synchronizing signal generating means which generates an internal synchronizing signal in response to the voltage change of the second converter means.

(17) The pulse stretching circuit according to the present invention receives a complementary pulse signal and generates a pulse signal with an amplified pulse width, and is provided with: a first logical circuit which generates a high level output when either one of the two inputs is low level; an inverter circuit which inverts the input, in which the negative pulse signal of the complementary pulse signal is applied to one of the input terminals of the first logical circuit and the positive pulse signal is applied to the other input terminal of the first logical circuit through the inverter circuit; and, further, a second logical circuit, which generates a low level output when either one of the two inputs is high level, may be provided in the later stage of the logical circuit, the output of the logical circuit of the initial stage may be applied to one of the input terminals of the logical circuit of the later stage, and the positive pulse signal may be applied to the other input terminals.

(18) Another pulse stretching circuit according to the present invention receives a complementary pulse signal, and generates a pulse signal with an amplified pulse width and is provided with: a logical circuit which generates a low level output when either one of the two inputs is high level; an inverter circuit which inverts the input, in which the positive pulse signal of the complementary pulse signal is applied to one of the input terminals of the logical circuit, and the negative pulse signal is applied to the other input terminal of the logical circuit through the inverter circuit; and further, another logical circuit, which generates a high level output when either one of the two inputs is low level, may be provided in the later stage of the logical circuit, the output of the logical circuit of the initial stage may be applied to one of the input terminals of the logical circuit of the later stage, and also the negative pulse signal may be applied to the other input terminal.

(19) The pulse stretching circuit according to another aspect of the present invention, which receives a positive and negative complementary pulse signal, and obtains a pulse signal with an amplified pulse width, arranges positive logic NOR circuit and negative logic NOR circuit alternatively and in multiple stages, and applies to one of the input terminals of each NOR circuit a positive pulse signal to a positive logic NOR circuit and a negative pulse signal to a negative logic NOR circuit, and further applies to the other input terminal of the NOR circuit of the first stage, the pulse signal which is different from the pulse signal applied to the one input terminal of the NOR circuit through an inverter, and also applies the output of the NOR circuit of the initial stage to the other input terminals of the NOR circuit below the second stage, and obtains a pulse with an amplified pulse width from the output terminals of any of the NOR circuits.

The signal change detector circuit of the present invention, once converts each voltage change of each signal, of which the change is to be detected, to a current pulse, and adds these current pulses in a node wherein the electric potential is almost constant, and converts these added electric currents to voltages. In more concrete terms, for example, after taking the logical sum of every current pulse mentioned with the cascode amplifier, the logical sum of the current pulses is converted to a voltage change. At the input terminal of the cascode amplifier, for example, for the ones with grounded base type bipolar transistor, because the voltage amplitude is as small as, about several 10 mV, it receives almost no effect from load, and the signal is transmitted at high speed.

This high speed characteristic, which is substantially independent from the number of signals to be detected of the level change, is especially suitable to be applied to the ATD circuit of a digital memory apparatus that adopts an inner synchronizing method which detects the change in the address signals and generates a reference signal, and is able to shorten the access time. An ATD circuit which applies the present invention can accomplish a high operation speed that is 2~3 times faster than prior ATD circuits.

Also, the pulse stretching circuit according to the present invention is suitable for stretching the pulse width of the output pulse of the ATD circuit, and by utilizing a complementary input circuit, it is able to stretch the pulse width of pulses which have pulse widths that are narrower than prior pulses.

Further, the use of the signal change detector circuit; according to the present invention is not restricted to the detection of address change in the memory apparatus, and can be applied to the detection of the voltage of at least one of a plurality of signals at high speed.

(20) In an output buffer circuit which includes an input terminal being inputted with signals from the internal part of a semiconductor integrated circuit, and an output terminal outputting signals to the outer circuit of said semiconductor circuit, and temporarily maintains the output potential at an electric potential between the source potential and the grounding potential on the basis of the outputted transition detector signals, which precedes the change of the said input that is to be propagated as the output, the present invention is characterized by being provided with a circuit that sets the electric potential to an intermediate voltage of $V_1$ when the electric potential of the output terminal of the data immediately before is "Low", and sets the electric potential to an intermediate voltage of $V_2$ when the electric potential of the output terminal of the data immediately before is "High".

In the output buffer circuit thus constructed, the referred-to intermediate levels of the electric potential are not exactly values of the "Low" level and the "High" level but, rather, are values which approach, on the one hand, the "Low" Level and, on the other hand, the "High" level, while maintaining the function to set up the intermediate value, the electric potential is assumed to be separated from the threshold potential of the other semiconductor integrated circuit. Thus, there will be no adverse influences to the input buffer circuit of other semiconductor integrated circuit.

BRIEF DESCRIPTION OF THE DRAWINGS

FIGS. 5(a)–5(c) are an example time chart of a conventional output buffer circuit;

FIG. 6 is a diagram illustrating a fundamental construction of a conventional output buffer circuit;

FIGS. 7(a)–7(d) are an example time chart of a conventional output buffer circuit;

FIG. 8 is a circuit diagram which shows an embodiment of an input buffer circuit which is incorporated to a semiconductor integrated circuit according to the present invention;

FIGS. 35(a)–35(c) are time charts for an embodiment of an output buffer circuit according to the present invention;

FIG. 36 is a block diagram that shows an embodiment of an output buffer circuit according to the present invention;

DETAILED DESCRIPTION OF THE PREFERRED EMBODIMENTS

The above described objectives and featured structural aspects as well as further objectives and aspects related to the present invention will become apparent from the following detailed description of preferred embodiments, described hereinbelow and illustrated in the accompanying drawings.

Figure 41:
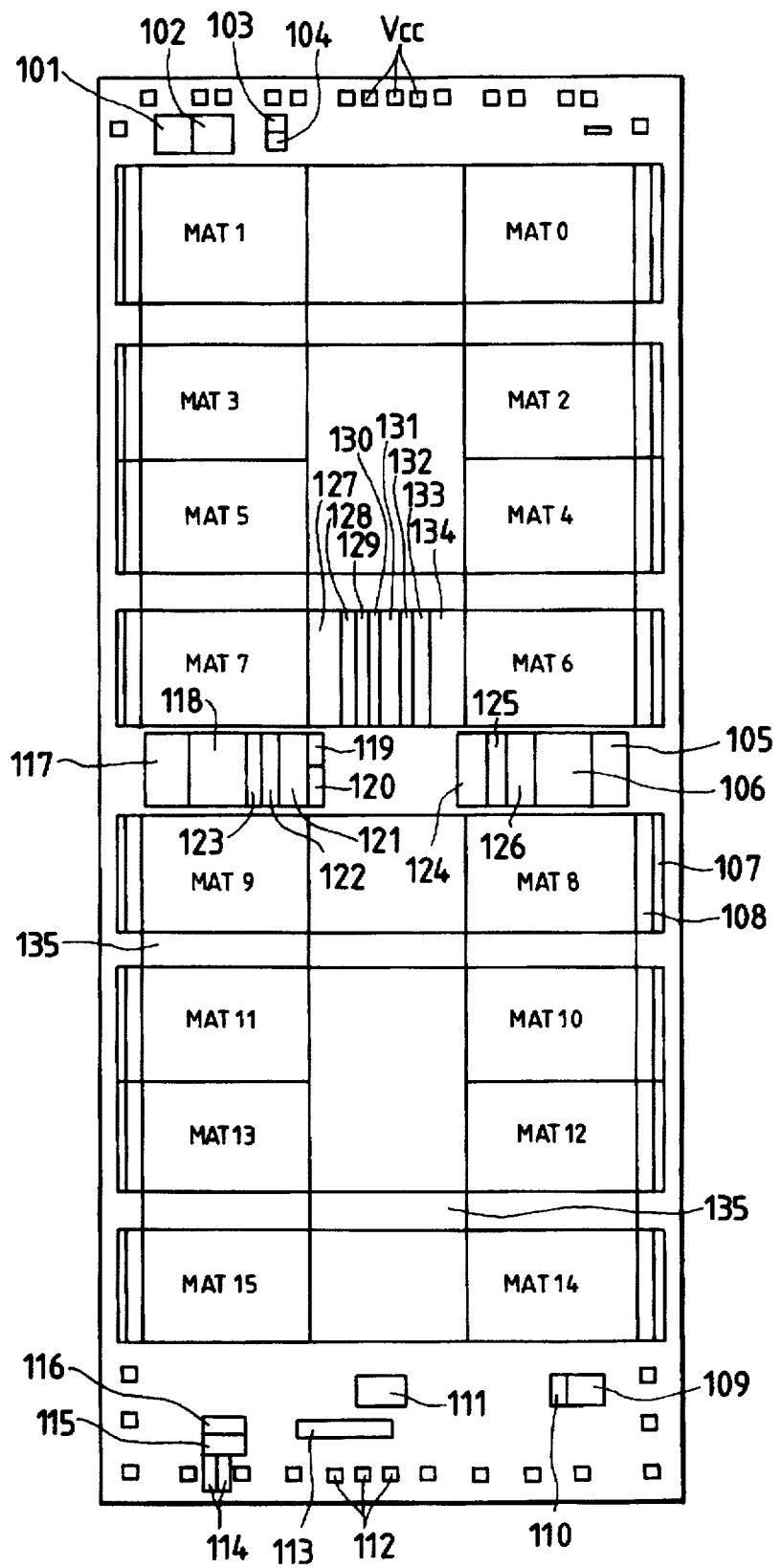
FIG. 41 is a chip layout of a SRAM device according to one embodiment of the present invention.

First of all, the present invention is explained by taking up a static random access memory (hereinafter abbreviated as SRAM) as an example. FIG. 41 is a chip layout diagram. Numeral 101 is a fuse circuit, 102 is a redundant address selection circuit for defect relief, 103 is a sign circuit for defect determination, 104 is a fuse circuit, and the source voltage is applied to the three terminals in the drawing. A memory array is divided into memory arrays (mats) MAT0–MAT15 disposed in the manner shown. MAT0–MAT1 are redundant memory arrays, however other MATs may be used for the redundant memory portion. In the region between the respective MATs, several kinds of circuits are to be disposed. Between MAT0 and MAT2, MAT4 and MAT6, MAT8 and MAT10, MAT12 and MAT14, MAT1 and MAT3, MAT5 and MAT7, MAT9 and MAT11 and MAT13 and MAT15, decoder circuits of X series (in the drawing subword driver 135) are disposed. Between MAT0 and MAT1, MAT2 and MAT3, MAT4 and MAT5, MAT6 and MAT7, MAT8 and MAT9, MAT10 and MAT11, MAT12 and MAT13, MAT14 and MAT15, decoders of Y series, sense amplifiers and the like are disposed. The structure between the MAT6 and MAT7 in the drawing is explained in detail. In the direction from the MAT6 to the MAT7, a Y switch circuit 134, a Y series second stage circuit 133, a presense amplifier 132, a write circuit 131, a Y series first stage circuit 130, a fuse circuit 129, a Y series second stage circuit 128, and a Y switch circuit 127 are arranged. Between the MAT6 and the MATS, an input buffer circuit 105 of an address series, a main word driver circuit 106, a data selection circuit 126, a cascode amplifier 125, and X series first stage circuit 124 are arranged. Between the MAT7 and the MAT9 an input buffer 117 of address series, a main word driver circuit 118, a signal change circuit (called as address transition detector circuit: ATD circuit) 123, a cascode amplifier 122, a X series first stage circuit 121, a $V_E$ power source 119, and an output signal control circuit 120 disposed in a center portion are arranged. Further outside the MATs, for example shown at the MATS, a pull-up MOS circuit 108 and a write enable signal line 107 are arranged. Numeral 135 represents a mat selection series circuit. At the peripheral portion near the MAT14 and the MAT15, a main sense amplifier circuit 109, an input buffer circuit 110 for data input use, an ADT output control and signal generation circuit 111, an output terminal 112, an output buffer circuit 116, an output MOS circuit 115, an output bipolar circuit 114, and a word address buffer circuit 113 are arranged. Nextly, a representative signal flow is explained. An address signal input from a predetermined pad is inputted to the memory cell array (in the drawing any of the MATs) through the input buffer circuit 105 of address series, the main word driver circuit 106, and the subword driver 135, and outputted from the pad near the output bipolar circuit 114 (at the moment of signal leading) or the output MOS circuit 115 (at the moment of signal trailing) through the Y switch 134, the presense amplifier 132, the cascode amplifier circuit 125, the main sense amplifier circuit 109, and the output buffer circuit 116.

For the respective circuits explained above, the circuits explained below are used.

Figure 10:
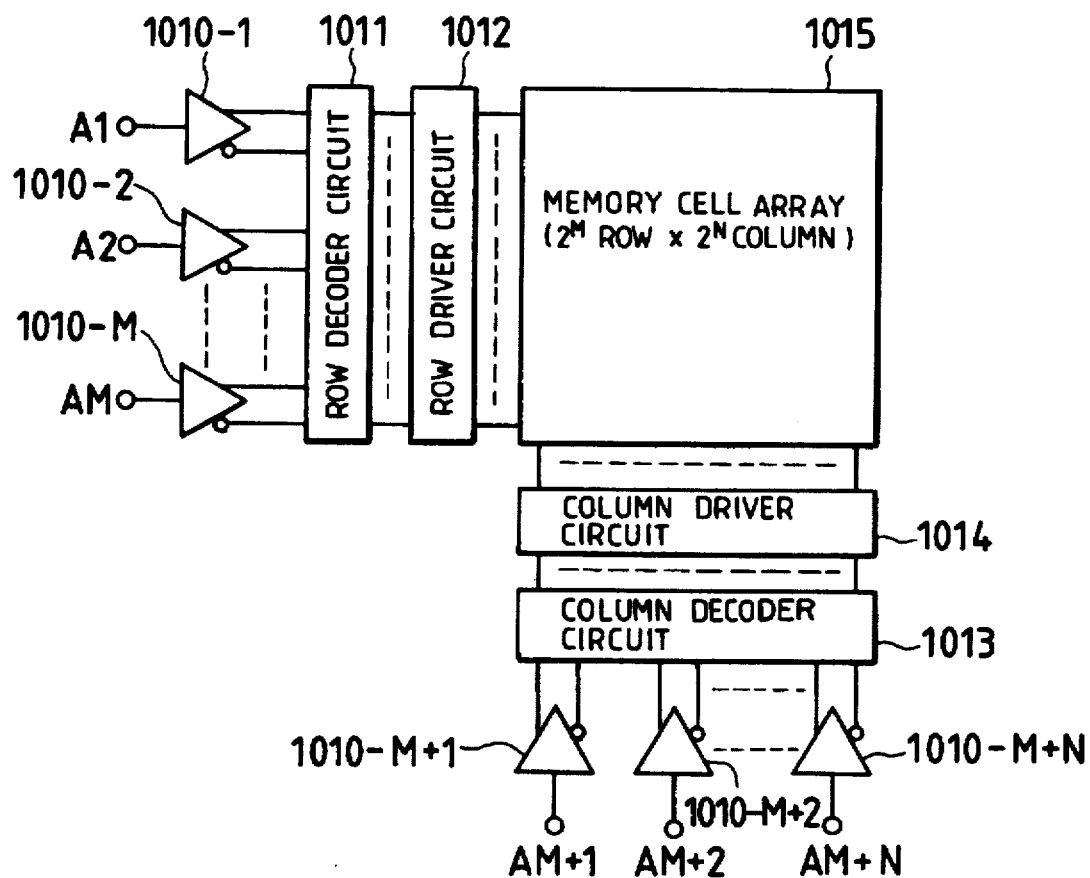
FIG. 10 is a schematic drawing of a memory apparatus to which the present invention is applied.

FIG. 10 shows a block diagram of a semiconductor memory block. In the diagram, 1010-1, 1010-2, 1010-M, 1010-M+1, 1010-M+2 and 1010-M+N are each input buffer circuits, and a non-inverted output and an inverted output are provided for the respective input address signals. 1011 is a row decoder circuit, and 1012 is a row driver circuit, which assigns a row address to a memory cell array 1015. 1013 is a column decoder circuit, and 1014 is a column driver circuit, which assigns a column address to the memory cell array 1015. The memory cell array 15 is a matrix array of $2^M$ row×$2^M$ column memory cells.

Each of the above input buffer circuits 1010-1, 1010-2, 1010-M, 1010-M+1, 1010-M+2, and 1010-M+N is composed of the circuit shown in FIG. 8. Each such input buffer circuit is composed of an inverting logical circuit 8101 to which an input signal Ai is applied, a non-inverting logical circuit 8102 to which the output of the inverting circuit 8101 is applied, and an inverting logical circuit 8103 to which the output of the inverting circuit 8101 is applied. The above inverting logical circuits 8101 and 8103 and the non-inverting logical circuit 8102 are each composed of a so-called Bi-CMOS transistor, which consists of a bipolar transistor and a MOS transistor. Among these, the inverting logic circuit 8101 constitutes a level inverter circuit and the non-inverting logical circuit 8102 and the inverting logical circuit 8103 constitute a driver circuit. According to such a construction, an output signal $\overline{ai}$ is outputted from the non-inverting logical circuit 8102, and an output signal ai is outputted from the inverting logical circuit 8103, of the driver circuit.

Figure 11:
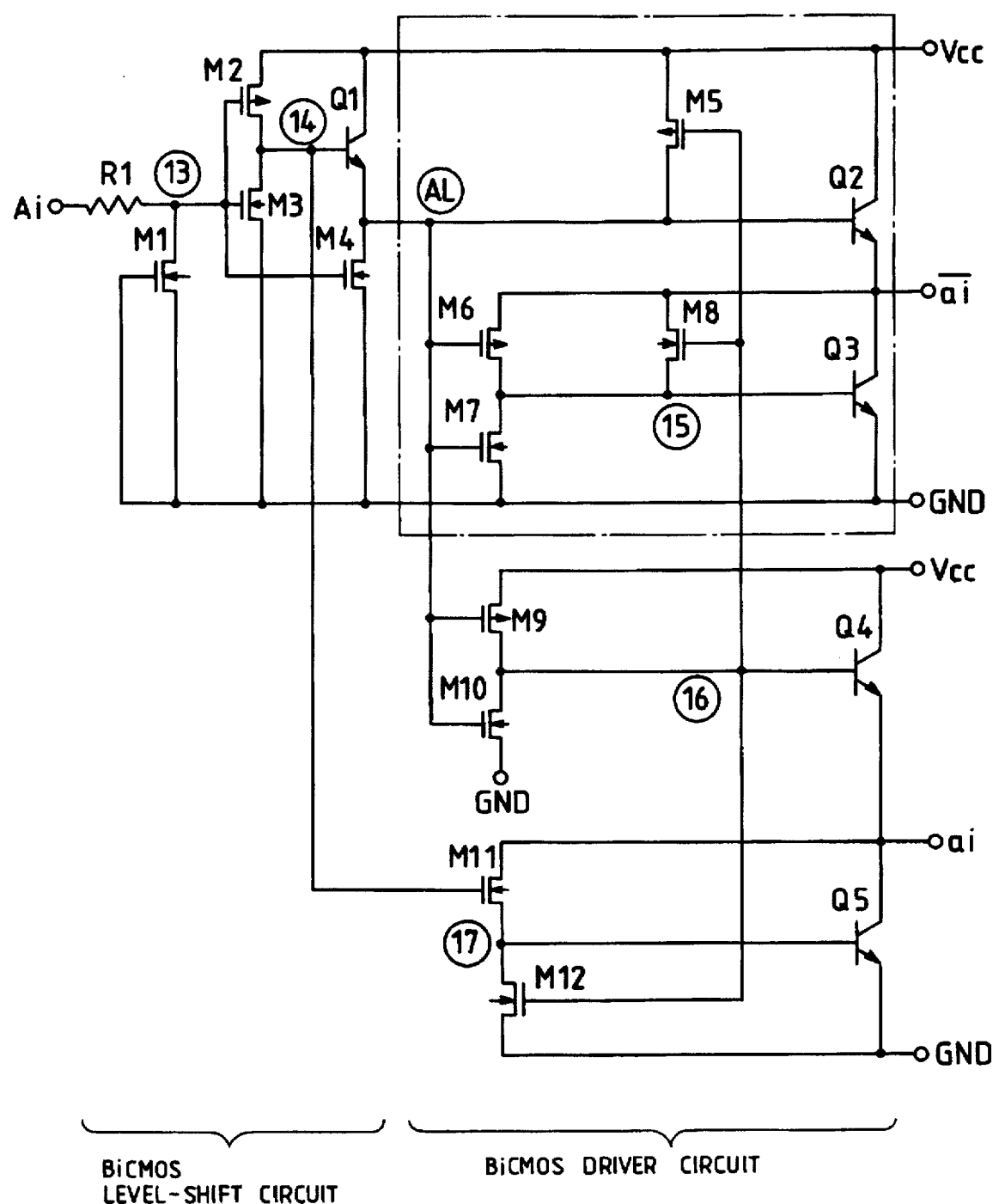
FIG. 11 is a detailed circuit diagram which shows an embodiment of the circuit shown in FIG. 8.

A concrete circuit of the input buffer circuit with such a construction is shown in FIG. 11. In the same diagram, an input signal Ai is to be applied to an input protection circuit which consists of a N channel MOS transistor $M_1$ and a resistor $R_1$. The output of this input protection circuit is to be applied to each gate of a pair of complementary MOS transistors composed of a P channel MOS transistor $M_2$ and a N channel MOS transistor $M_3$. The output from the juncture of the complementary MOS transistors is applied to the base of a bipolar transistor $Q_1$, and to the gate of a N channel MOS transistor $M_4$, which is connected in series to the bipolar transistor $Q_1$, an input which is the same as the input to the gate of the complementary MOS transistor is applied.

Further, electric source Vcc is connected to the source of the P channel MOS transistor $M_2$ and the collector of the bipolar transistor $Q_1$. Also, the source and gate of the N channel MOS transistor $M_1$, the source of the N channel MOS transistor $M_3$, and the source of the P channel MOS transistor $M_4$ are grounded.

The above construction is a construction of the non-inverting logical circuit 8101 in FIG. 8, namely a level converter circuit.

Next, the output at the common node of the bipolar transistor $Q_1$ and the P channel MOS transistor $M_4$ is applied to the base of the bipolar transistor $Q_2$. Further, the input is to be commonly applied to each gate of a complementary pair of MOS transistors composed of a P channel MOS transistor $M_6$ and a N channel MOS transistor $M_7$. The output of the common node of the complementary MOS transistor is to be applied to the base of the bipolar transistor $Q_3$, and this bipolar transistor $Q_3$ is connected in series to the bipolar transistor $Q_2$. The common node of the bipolar transistors $Q_2$ and $Q_3$ is connected to the source of the P channel MOS transistor $M_6$, and also constitutes the output terminal $\overline{ai}$.

Further, the electric source Vcc is connected to the collector of the bipolar transistor $Q_2$; also, the source of the P channel MOS transistor $M_7$ and the emitter of the bipolar transistor $Q_3$ are grounded. Also, a P channel MOS transistor $M_5$ is put between the electric source Vcc and the base of the bipolar transistor $Q_2$, and N channel MOS transistor $M_8$ is put between the output terminal $\overline{ai}$ and the base of the bipolar transistor $Q_3$, and an input from the following circuit is to be supplied to these gates.

The above construction is a construction of the non-inverting logical circuit 8102 in FIG. 8.

Next, the output of the node of the bipolar transistor $Q_1$ and the P channel MOS transistor $M_4$ is to be commonly applied to each gate of a pair of complementary MOS transistors which consist of the P channel MOS transistor $M_9$ and a N channel MOS transistor $M_{10}$. The output at the common juncture of this pair of complementary MOS transistors is to be applied to the base of the bipolar transistor $Q_4$. Meanwhile, an input is to be applied from the base of the bipolar transistor $Q_1$ to the gate of a N channel MOS transistor $M_{11}$. P channel MOS transistor $M_{12}$ is connected in series to this N channel MOS transistor $M_{11}$ and an input is to be applied to that gate from the base of the bipolar transistor $Q_4$. Also, an input is to be applied from the base of the bipolar transistor $Q_4$ to each gate of the P channel MOS transistor $M_5$ and the N channel MOS transistor $M_8$. The output of the common node of the N channel MOS transistor $M_{11}$ and the P channel MOS transistor $M_{12}$ is to be applied to the base of the bipolar transistor $Q_5$, and this bipolar transistor $Q_5$ is to be connected in series to the bipolar transistor $Q_4$. The common node of the bipolar transistor $Q_4$ and the bipolar transistor $Q_5$ is connected to the drain of the N channel MOS transistor $M_{11}$ and constitutes the output terminal ai.

Further, the source of the P channel MOS transistor $Q_9$ and the collector of the bipolar transistor $Q_4$ are connected to the electric source Vcc; also, the source of the N channel MOS transistor $M_{10}$, the source of the N channel MOS transistor $M_{12}$, and the emitter of the bipolar transistor $Q_5$ are grounded.

The above construction is a construction of the inverting logical circuit 8103 of FIG. 8.

The operation of the input buffer circuit thus constructed will be explained in the following.

In the case where the input signal is 'High' level, the P channel MOS transistor $M_2$ turns OFF, and the N channel MOS transistor $M_3$ turns ON, and by turning OFF the bipolar transistor $Q_1$, and turning ON the P channel MOS transistor $M_4$, the output (AL) of the level converter circuit becomes 'Low' level. Thus, the P channel MOS transistor $M_6$ becomes ON and the N channel MOS transistor $M_7$ becomes OFF; also, because the P channel MOS transistor $M_9$ and the N channel MOS transistor $M_{10}$ make up a complementary MOS inverter, node (16) becomes 'High' level, and the P channel MOS transistor $M_5$, which receives a gate signal from the node (16), becomes OFF, and the N channel MOS transistor $M_8$ becomes ON. Because the bipolar transistor $Q_2$ becomes OFF, and the bipolar transistor $Q_3$ becomes ON, the output signal ai from the output terminal $\overline{ai}$ becomes 'Low' level. With the same idea in connection with the output signal ai, the P channel MOS transistor $M_9$ becomes ON, the N channel MOS transistor $M_{10}$ becomes OFF, the N channel MOS transistor $M_{11}$ becomes OFF, and the N channel MOS transistor $M_{12}$ becomes ON. Because the bipolar transistor $Q_4$ becomes ON, and the bipolar transistor $Q_5$ becomes OFF, the output signal ai from the output terminal ai becomes 'High' level. Further, in the case when the input signal is "Low" level, the MOS transistors and the bipolar transistors operate reversely to that described above and such that the output signal $\overline{ai}$ becomes "High" level, and ai becomes "Low" level.

In the input buffer circuit thus constructed, because the output from the input level converter circuit, which is equivalent to the inverting logical circuit 8101 of FIG. 8, is outputted through the non-inverting logical circuit 8102, and the inverting circuit 8103, of which respective constructions are very similar, output signals $\overline{ai}$ and ai can be obtained at almost the same time. Therefore, since the late signal is not used as reference as in the prior art, a high speed operation is achieved.

Also, for the high speed operation of the above circuit, measures are taken for the method of connection between the level converter circuit and the driver circuit, and between the two driver circuits. In other words, the gate of the N channel MOS transistor $M_{11}$ of the driver circuit which outputs the non-inverted signal ai is connected to node (14) within the level converter circuit. By taking a gate signal from the node (14) with a small delay time, rather than the output (AL) within the level converter circuit, the time needed for the electric potential ai to change from 'High' to 'Low' can be decreased. Further, the gate of the P channel MOS transistor $M_5$, included in the driver circuit which outputs the inverted signal $\overline{ai}$, takes a signal from the node (16) of the driver circuit which outputs the non-inverted signal ai, and the P channel MOS transistor $M_5$ performs an auxiliary function for the change of the electric potential of the node (AL) from 'Low' to 'High'. By this function of the P channel MOS transistor $M_5$, the time needed for changing the electric potential of (AL) from 'Low' to 'High' is decreased, and this also decreases the changing (or transition) time for the electric potential of the output (16) of the inverter formed by $M_9$ and $M_{10}$, which receives the signal of (AL), from 'High' to 'Low'. Thus the P channel MOS transistor $M_5$ functions as a feedback within the driver circuit, and contributes to the high speed operation of the driver circuit.

The measures for the high speed operation mentioned above are possible only with the use of the combined circuit of the MOS transistor and the bipolar circuit for the level converter circuit, and the driver circuit.

Figure 12:
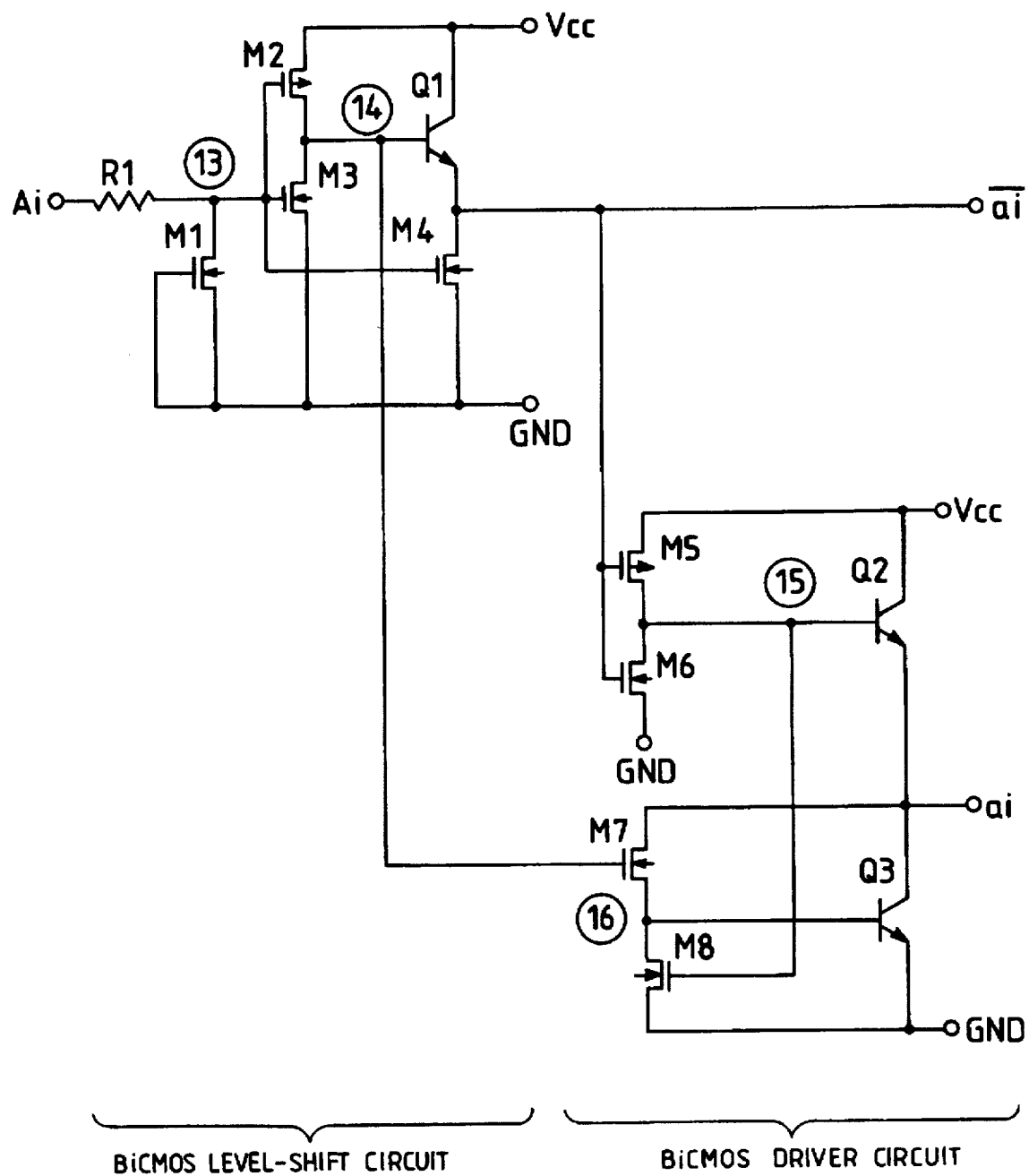
FIG. 12 is a circuit diagram which shows a variation of the circuit shown in FIG. 11.

Also, because the ultimate object for the embodiment shown in FIG. 11 is to achieve a high speed operation, it is needless to say that it is possible to eliminate the circuit part which corresponds to the non-inverting logical circuit 8102 of FIG. 8, and enable the output of the level converter circuit to be taken as the output signal $\overline{ai}$ without a modification for the input buffer circuit. The circuit for this case is shown in FIG. 12. In this case, output signal ai is emitted faster compared to the output signal $\overline{ai}$, but because the slower signal, or the output signal ai is used as a reference, the same high speed operation as that of the embodiment shown in FIG. 11 can be obtained.

Figure 9:
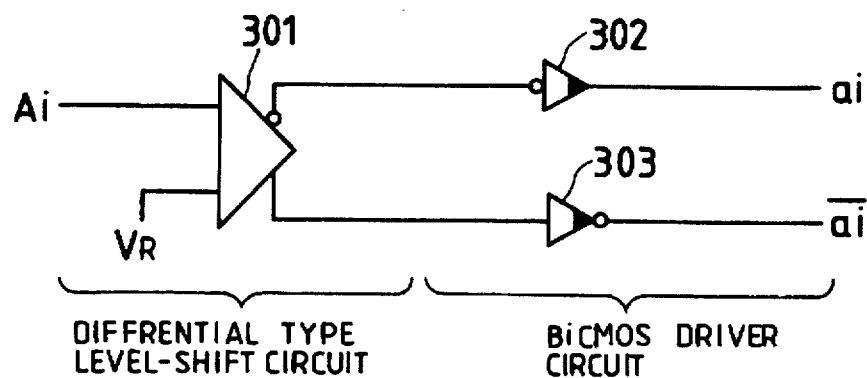
FIG. 9 is a circuit diagram of another embodiment of an input buffer circuit incorporated to a semiconductor integrated circuit according to the present invention.

Next, another embodiment or an input buffer circuit according to the present invention will be shown in FIG. 9.

In the same diagram, the input signal Ai is applied to a differential level converter circuit 301. And from the output of the inverted signal terminal of this differential level converter circuit 301, the output signal ai is obtained through the inverted logical circuit 302. And further from the output of the non-inverted signal terminal of the differential type level converter circuit 301, the output signal $\overline{ai}$ is obtained through the inverted logical circuit 303.

Figure 13:
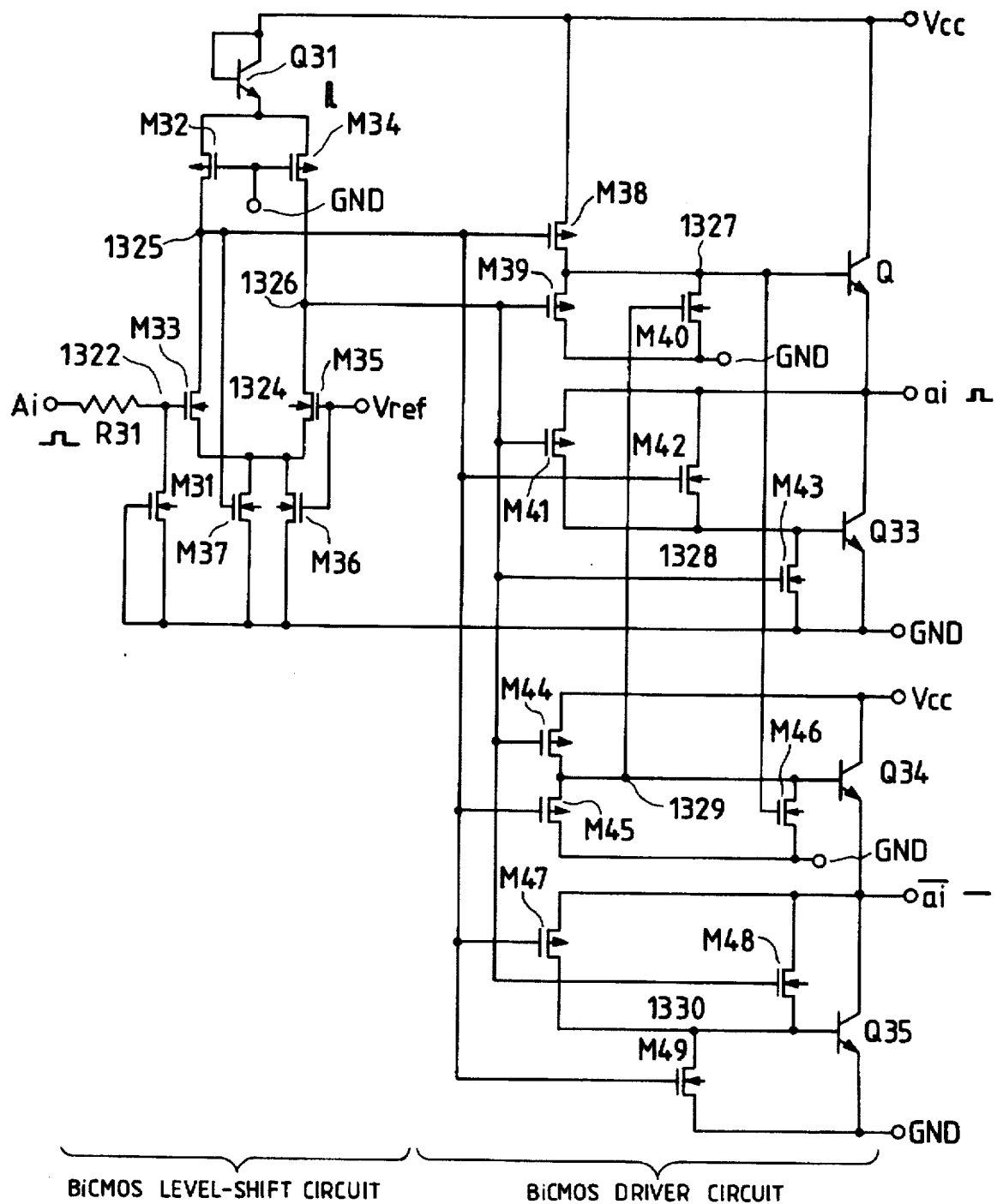
FIG. 13 is a detailed circuit diagram which shows an embodiment of the circuit shown in FIG. 9.

FIG. 13 shows a concrete circuit diagram of the input buffer circuit which consists of such a constitution. In the same diagram, an input circuit is constructed by a N channel MOS transistor $M_{31}$ and a resistor $R_{31}$. Also, a bipolar transistor $Q_{31}$, and P channel MOS transistors $M_{32}$ and $M_{34}$, and N channel MOS transistors $M_{33}$, $M_{35}$, $M_{36}$ and $M_{37}$ constitute a level converter circuit of a differential circuit type. And the inverter circuit that provides ai consists of P channel MOS transistors $M_{38}$, $M_{39}$ and $M_{41}$, N channel MOS transistors $M_{40}$, $M_{42}$ and $M_{43}$ and bipolar transistors $Q_{32}$ and $Q_{33}$. Further, the inverter circuit which outputs $\overline{ai}$ consists of P channel MOS transistors $M_{44}$, $M_{45}$ and $M_{47}$, N channel MOS transistors $M_{46}$, $M_{48}$ and $M_{49}$ and bipolar transistors $Q_{34}$ and $Q_{35}$.

Here, in the above level converter circuit of the differential type, the bipolar transistor $Q_{31}$ is used to lower by $1V_{BE}$ the 'High' level potential of nodes 1325 and 1326, which is the output potential for the level converter circuit, and the P channel MOS transistors $M_{32}$ and $M_{34}$ are used as load components of the differential circuit. Also, the N channel MOS transistors $M_{36}$ and $M_{37}$ constitute a constant current source.

The operation of the input buffer circuit thus constructed will be explained in the following.

First, when the input signal Ai becomes 'High' level, the node 1325 which is the output of the level converter circuit becomes 'Low', and the 1326 becomes 'High' level At this moment, because the P channel MOS transistor $M_{38}$ becomes ON, the P channel MOS transistor $M_{39}$ becomes OFF, the P channel MOS transistor $M_{41}$ becomes OFF, the N channel MOS transistor $M_{42}$ becomes OFF, and the N channel MOS transistor $M_{43}$ becomes ON, and node 1329 is at 'Low' level, the N channel MOS transistor $M_{40}$ turns OFF, and because the bipolar transistor $Q_{32}$ becomes ON, and the bipolar transistor $Q_{33}$ becomes OFF, the output signal ai becomes 'High' level. Also, because the P channel MOS transistor $M_{44}$ becomes OFF, the P channel MOS transistor $M_{45}$ becomes ON, the P channel MOS transistor $M_{47}$ becomes ON, the N channel MOS transistor $M_{48}$ becomes ON, and the N channel MOS transistor $M_{49}$ becomes OFF, and node 1327 is at 'High' level, the N channel MOS transistor $M_{46}$ turns ON, and because the bipolar transistor $Q_{34}$ becomes OFF, and the bipolar transistor $Q_{35}$ becomes ON, the output signal $\overline{ai}$ becomes 'Low' level. In the case where input signal $\overline{ai}$ is 'Low' level, the MOS transistors and the bipolar transistors will operate reversely to that described above, and the output signal ai will become 'Low', and ai will become 'High' level.

As is clear from the explanation above, with the semiconductor apparatus according to the present invention, an input buffer circuit having high speed operation is provided.

Again, with reference to FIG. 10, the decoder circuits 1011 and 1012 each receive the outputs from the input buffer circuits 1010-1, 1012-2, . . . , 1010-M+N, the decoder circuits perform a logic operation, and are provided with a function that selects a memory cell from the memory cell array 1015.

Figure 14:
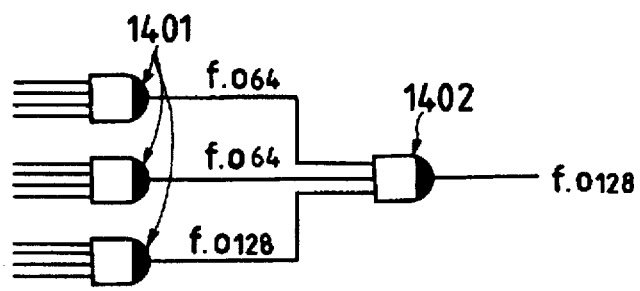
FIG. 14 is a block diagram which shows an embodiment of a decoder circuit according to the present invention.

And the decoder circuits 1011 and 1012 are composed, shown in FIG. 14, of a two stage construction logical circuit. In the same diagram, the output from the above input buffer circuit is to be first received by a primary logical gate 1401. This primary logical gate 1401 is formed of an AND circuit which is formed of a Bi-CMOS, and it is formed of three of them in the same diagram. Each output of each primary logical gate 1401 is to be applied to the input of the final logical gate 1402. This final logical gate 1402 is composed of an AND circuit of a Bi-CMOS having a low input capacity and a high driving force.

Figure 15:
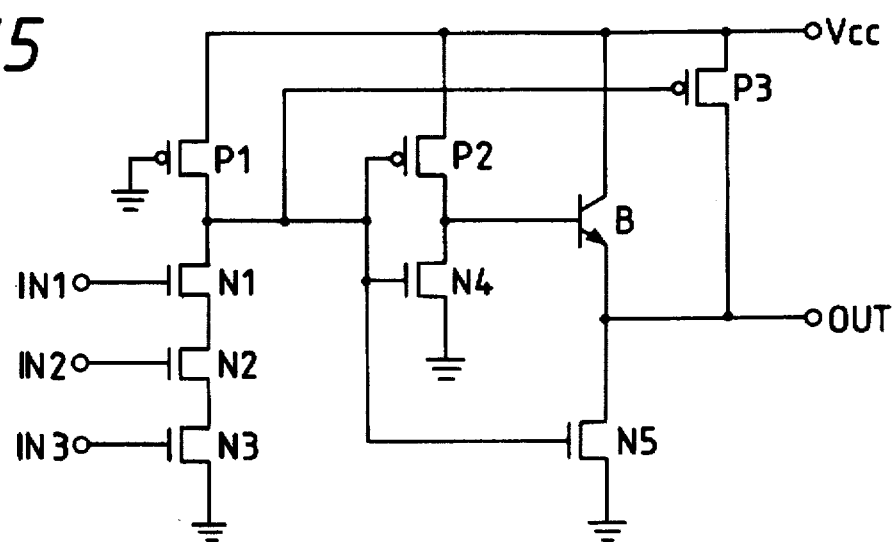
FIG. 15 is a block diagram which shows an embodiment of a logical gate used in the decoder circuit.

FIG. 15 shows a concrete circuit diagram of the AND circuit of the Bi-CMOS shown in FIG. 14. In the same diagram, the electrical source Vcc is grounded through a resistor formed of a P channel MOS transistor $P_1$, and series connected consecutive N channel MOS transistors $N_1$, $N_2$ and $N_3$. Input Signals $IN_1$, $IN_2$ and $IN_3$ are to be applied to the N channel MOS transistors $N_1$, $N_2$, and $N_3$, respectively. The output from the node of the P channel MOS transistor $P_1$ and the N channel MOS transistor $N_1$ is to be applied to each gate of the CMOS transistor arrangement formed of a P channel MOS transistor $P_2$ and a N channel MOS transistor $N_4$. In this case, the electrical source Vcc is supplied to the source of the P channel MOS transistor $P_2$, and the source of the N channel MOS transistor $N_4$ is grounded. The output from the intermediate node of the CMOS transistor arrangement is applied to the base of a bipolar transistor B. In this case, the electrical source Vcc is supplied to the collector of the bipolar transistor B, and the emitter is grounded through a N channel MOS transistor $N_5$. The input to the gate of the CMOS transistor arrangement is to be applied to the gate of the N channel MOS transistor $N_5$, and is provided with a function that quickly lowers the output to the grounding potential when the node of the bipolar transistor B and the N channel MOS transistor $N_5$ becomes Low level. A P channel MOS transistor is disposed between the node of the bipolar transistor B and the N channel MOS transistor $N_5$, and the electric source Vcc, and to the gate thereof, the input of the CMOS transistor arrangement is to be applied, and is provided with a function that quickly raises the output up to the Vcc potential when the node of the bipolar transistor B and the N channel MOS transistor $N_5$ becomes High level.

In the AND circuit formed of such construction, if the front half is assumed to be a circuit formed of the P channel MOS transistor $P_1$ and the N channel MOS transistors $N_1$, $N_2$ and $N_3$, and the rear half is assumed to be a circuit formed of the remaining transistors, the front half will have a low input capacitance but the load driving force will be small. However, the rear half will have a high load driving force.

Figure 16:
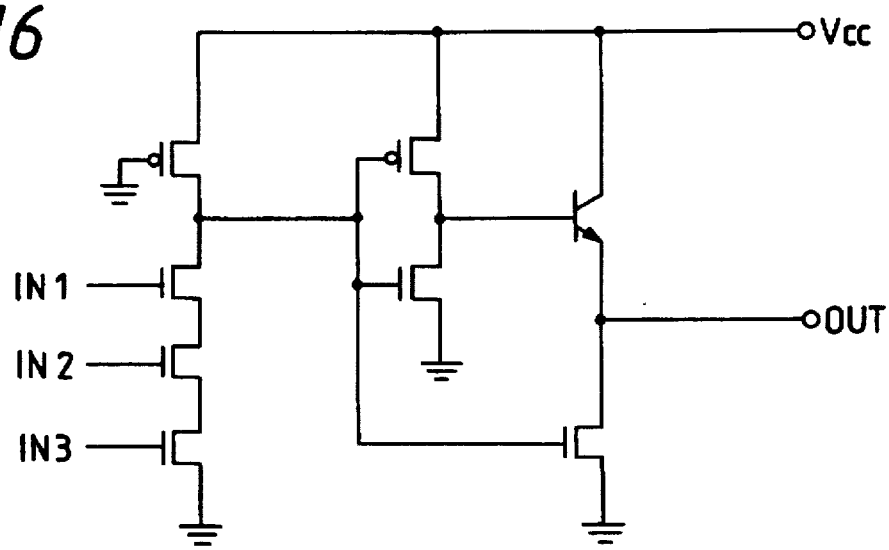
FIG. 16 and FIG. 17 are respectively block diagrams of the other embodiment of the logical gate.

FIG. 16 is provided with the same functions as FIG. 15, but excludes the circuit that raises the output to the electric source Vcc.

Figure 17:
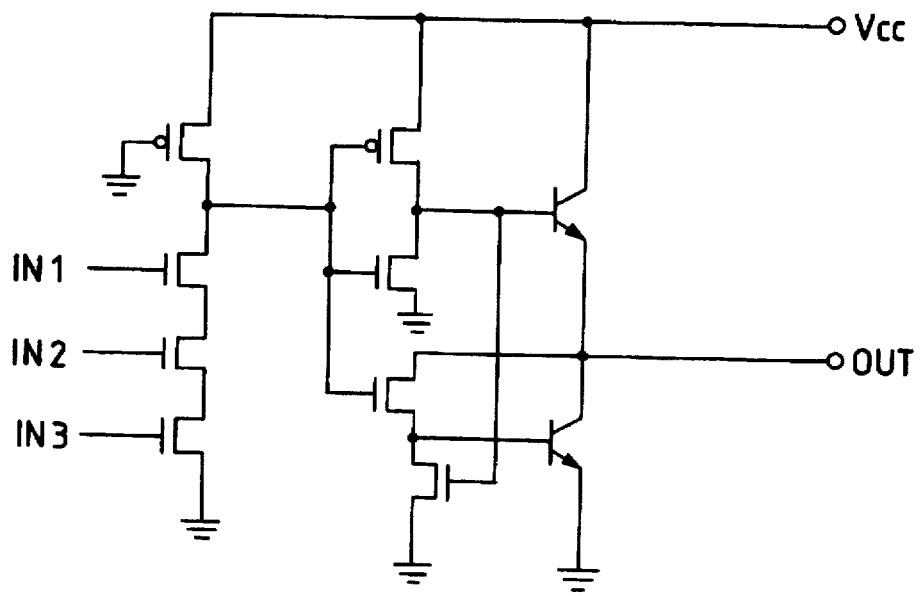

Also, FIG. 17 is provided with the same functions as FIG. 16, but especially uses a bipolar transistor for the circuit that lowers the output to the grounding potential.

In the above AND circuit formed of a Bi-CMOS transistor arrangement, each input capacitance of the final gate 1402 which is to be driven by any primary stage gate 1401 shown in FIG. 14, is either one of the gate capacitances of the N channel MOS transistors $N_1$, $N_2$ and $N_3$ of the circuit in FIG. 15. These N channel MOS transistors $N_1$, $N_2$ and $N_3$, perform a logic operation and generate a voltage amplitude to the extent that is only enough to operate the rear half of the circuit, so that the N channel MOS transistors of small gate size is sufficient. Therefore, the input load capacitance for every gate is kept low.

As is clear from the explanation above, with the decoder circuit according to the present invention, because the logical gate uses a Bi-CMOS transistor arrangement with a large driving force and a small input capacitance, the load capacity can be kept low even if the fan-out increases; therefore, a high speed operation is achieved.

For example, in the decoder circuit in FIG. 14, formed of the logical gates shown in FIG. 15, the delay time from the primary stage input to the final stage output is about 1.9 nsec, which is expected to achieve a great improvement compared to the conventional delay time which was about 2.4 nsec.

With the above construction, a decoder circuit with a high operating speed is provided even if the fan-out for every gate increases.

Figure 19:
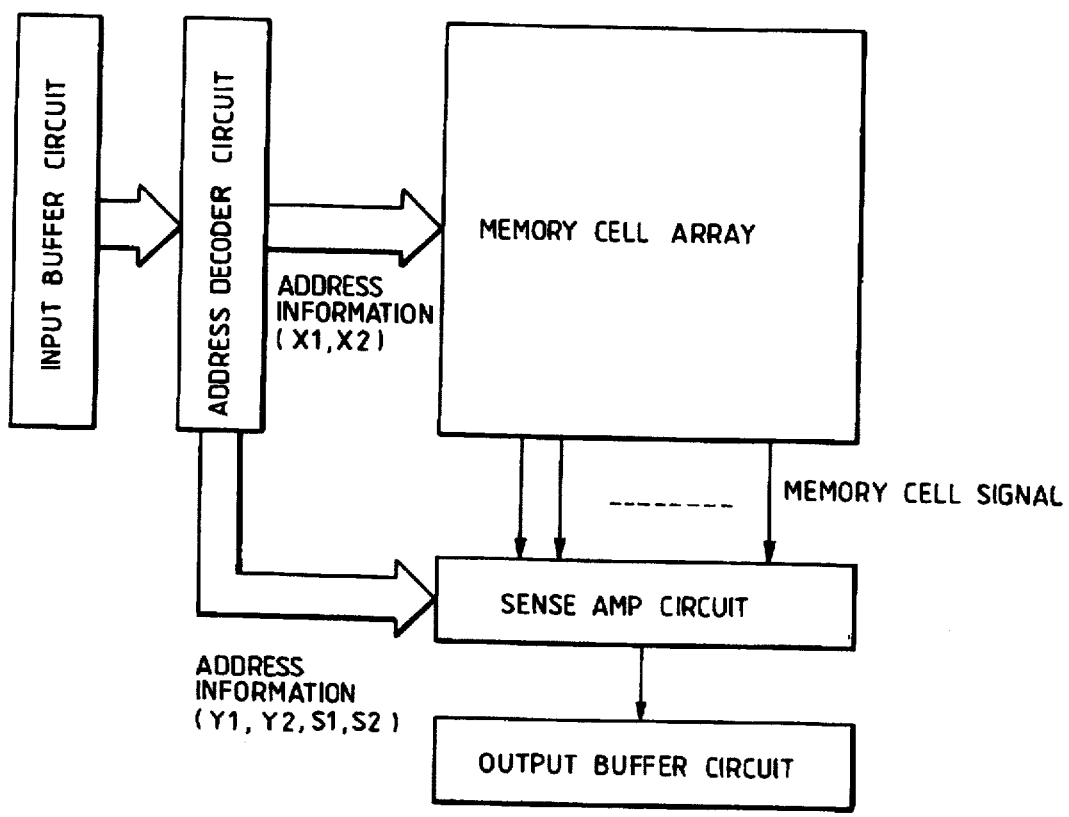
FIG. 19 is a schematic diagram illustrating whole constitution of a semiconductor memory device according to an embodiment of the present invention.

FIG. 19 shows a schematic constitution of a semiconductor memory device. An address signal inputted into the input buffer is decoded into address information to the respective addresses through an address decoder. Information selected by an address in a row direction (X1, X2) and an address in a column direction (Y1, Y2, S1, S2) in a memory cell array is amplified in a sense amplifier and inputted into an output buffer and therefrom outputted to the externals. Further, in FIG. 19 the writing-in circuit, for example, is omitted.

Figure 18:
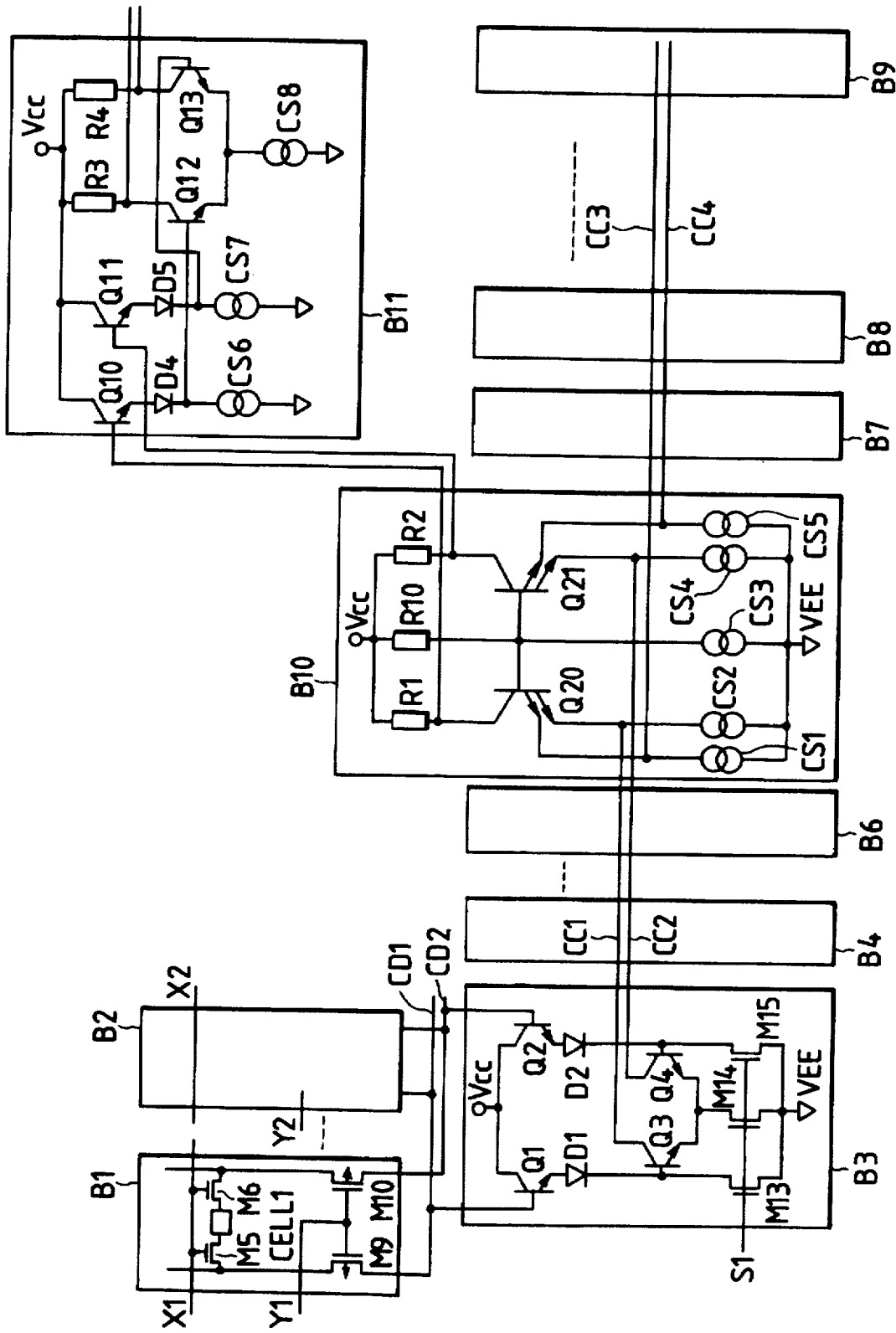
FIG. 18 is a diagram illustrating a part of a sense amplifier and a memory cell array according to one embodiment of the present invention.

Next, a part of the memory cell array and the sense amplifier in FIG. 19 is illustrated in FIG. 18.

Outputs from data line blocks B1 and B2 in the memory cell array are outputted to a pair of common data lines CD1 and CD2. The pair of common data lines are inputted to a presense amplifier block B3. A plurality of presense amplifier blocks such as B3, B4, and B6 are connected to a pair of common collector lines CC1 and CC2. Further, to a pair of common collector lines CC3 and CC4, which are the other pair of common data lines, the other plurality of presense amplifier blocks such as B7, B8 and B9 are connected.

These two pairs of common data lines are connected to one cascode amplifier block B10. The output of the cascode amplifier block B10 is inputted to a current switch block B11.

The presense amplifier blocks (for example, B3, B4, and B6) are differential voltage-differential current converting means which outputs the differential voltage appearing between the pair of common data lines CD1 and CD2 to the pair of common collector lines CC1 and CC2 in the form of differential current.

The cascode amplifier block B10 is current-voltage converting means which converts the differential current appearing between the pair of common collector lines CC1 and CC2 (or CC3 and CC4) into a voltage signal.

One including the presense amplifier block, the cascode amplifier block and the current switch block works as the sense amplifier.

In the embodiment of FIG. 18, the cascode amplifier includes multi emitter bipolar transistors, such as Q20 and Q21 having two emitters, within the cascode amplifier block. Thereby the common collector lines which are common data lines and connected to the cascode amplifier block B10 are divided into two pairs, such as the pair CC1 and CC2 and the pair CC3 and CC4. Thereby the capacitance and the resistance for every one pair of common collector lines which are a pair of common data lines are possibly reduced in comparison with the case in which such division is not effected.

In the present embodiment, the number of emitters is selected as two, however more than three may be selected. In such case the common data lines are divided into more than three.

Figure 1:
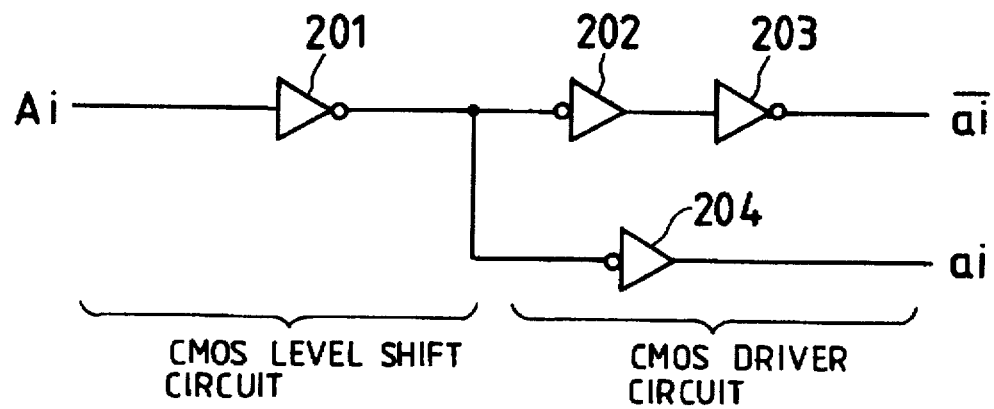
FIG. 1 is a circuit diagram of an example of a conventional input buffer circuit.
Figure 2:
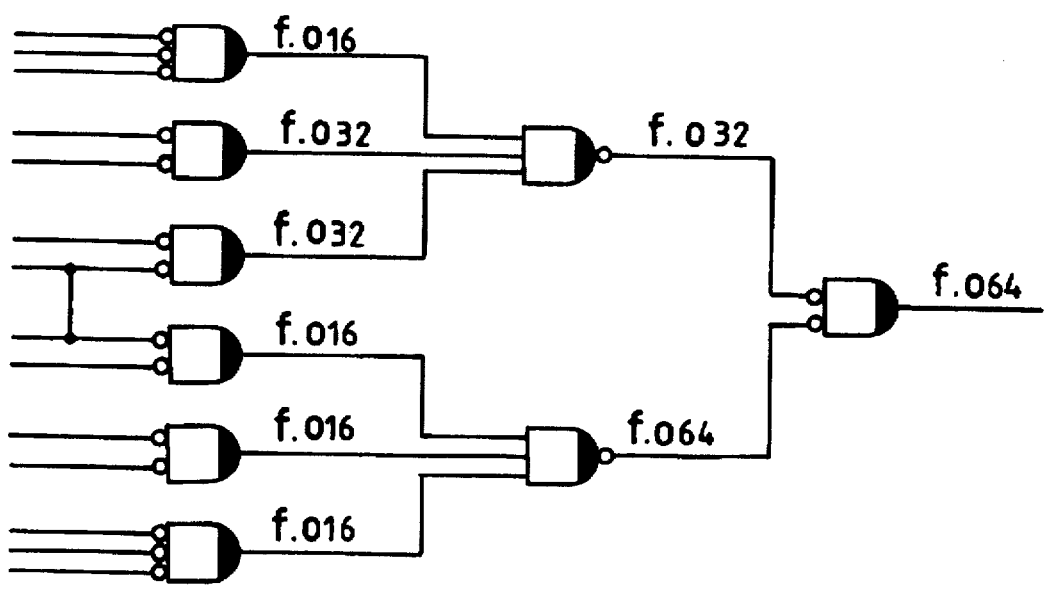
FIG. 2 is a block diagram that shows an example of a conventional decoder circuit.
Figure 3:
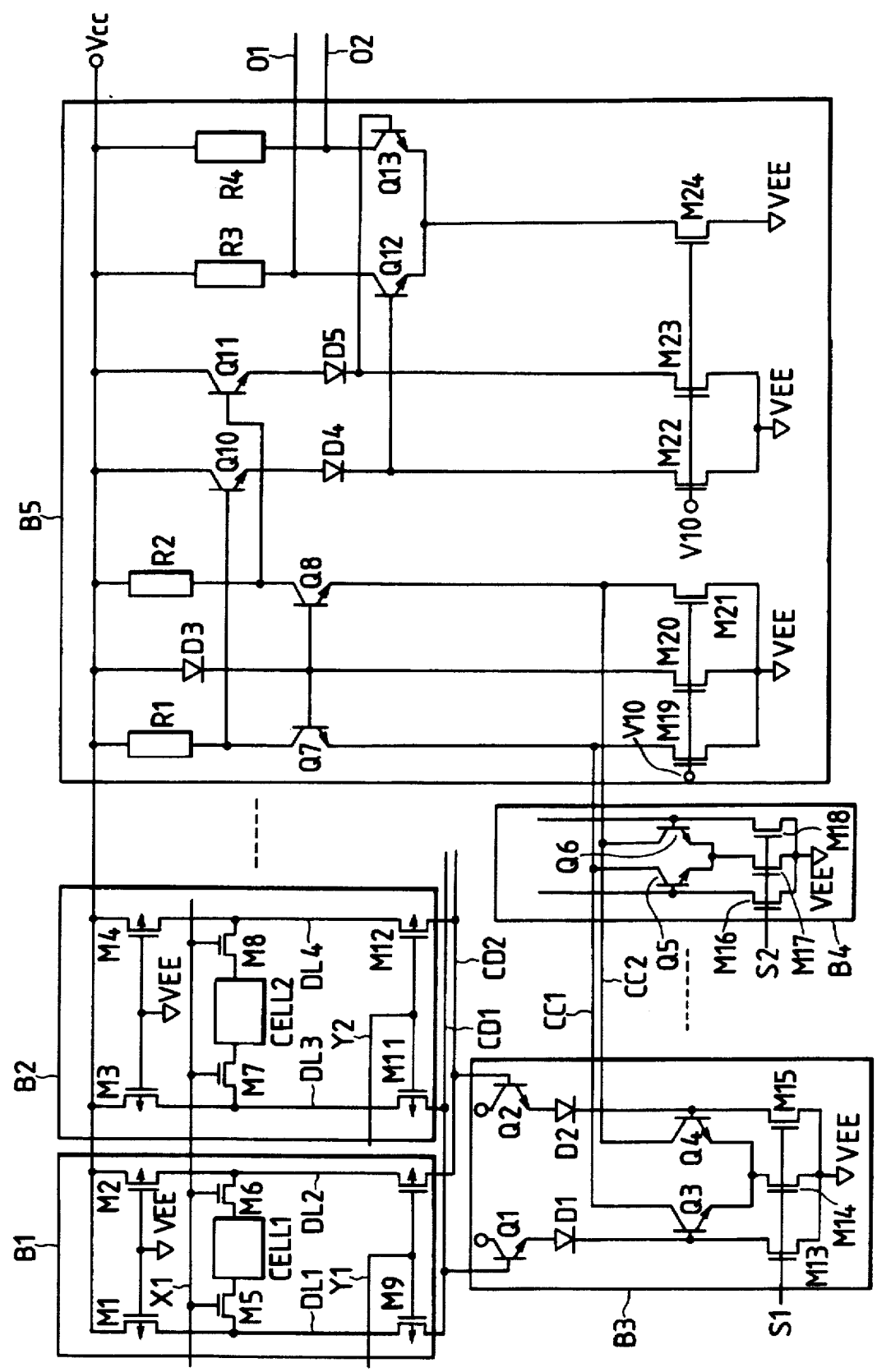
FIG. 3 is a diagram illustrating an example of a conventional sense amplifier and a memory cell array.
Figure 4:
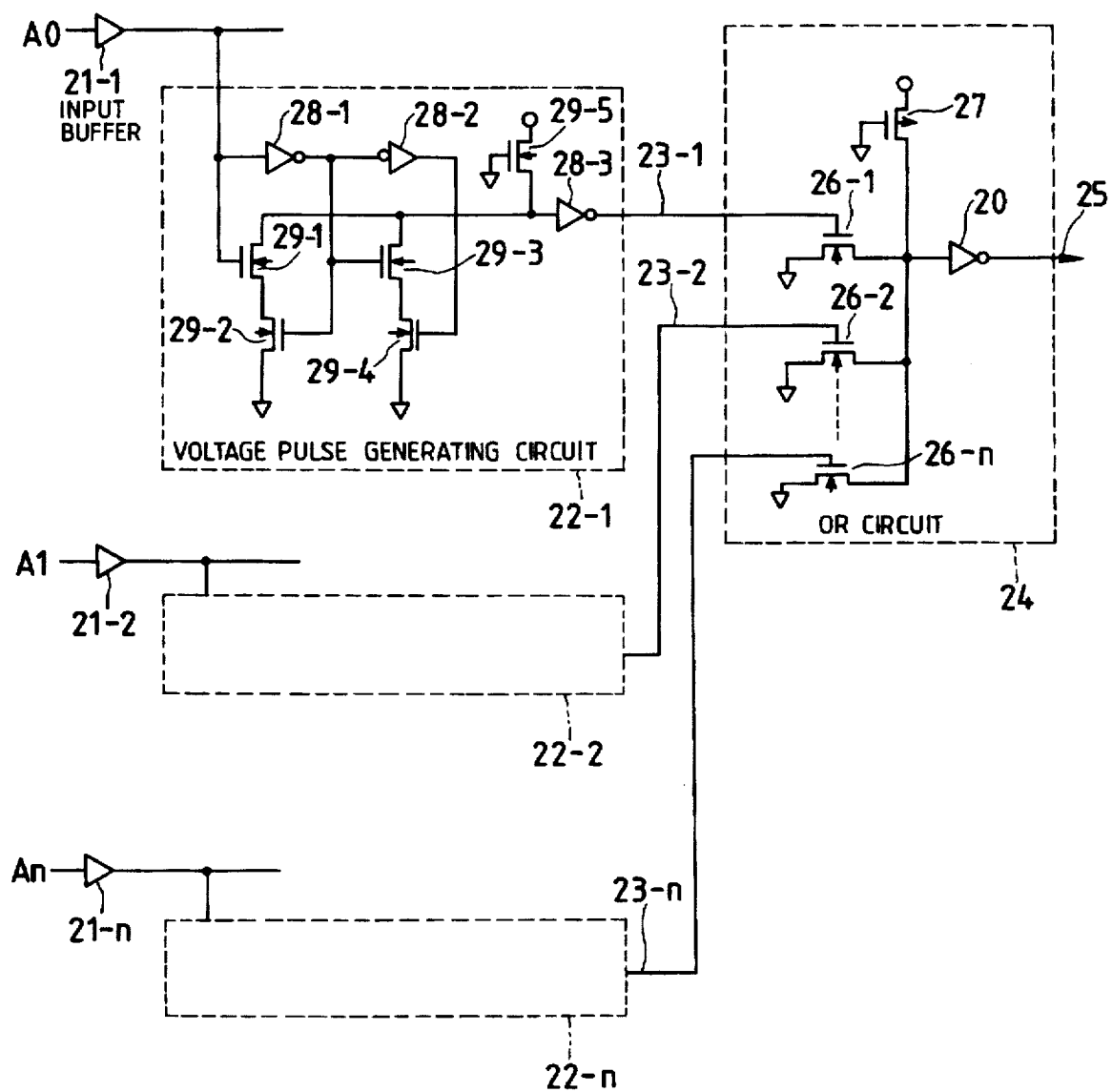
FIG. 4 is a block diagram of a conventional ATD circuit.

The present embodiment is compared with the conventional constitution of FIG. 3.

The point that the data from the data line blocks B1 and B2 in the memory cell array as the differential voltage signal of the common data lines CD1 and CD2 is converted into current at the presense block B3 is the same as that in FIG. 3. A point of difference between FIG. 18 from that of FIG. 3 is that the transistors Q7 and Q8 of the cascode amplifier in FIG. 3 are quite differently presented in FIG. 18 in which the cascode amplifier block B10 is constituted by the multi emitter (bipolar) transistors Q20 and Q21 and the fact that common collector lines are divided, as discussed above. CS1~CS5 in block B10 are constant current sources, R10 is a resistor (which may be constituted by such as a diode) and is a load element for maintaining the base potential of the multi emitter transistor at a predetermined value. The block B10 is called a multi emitter cascode amplifier. In FIG. 19, number of emitters of the multi emitter transistors Q20 and Q21 is two, however, when the number of emitters is increased number of pairs of the input common collector lines is increased, also.

Among all common collector lines inputted into one multi emitter cascode amplifier, only one presense block (for example B3, B4, B6, B7, B8, and B9) has to be activated by a selection signal (for example S1) inputted to the respective presense block.

According to the present embodiment without substantial increase of element number, the parasitic capacitance and the parasitic resistance of the common collector lines are reduced and an advantage of high speed signal transmission is achieved.

Figure 20:
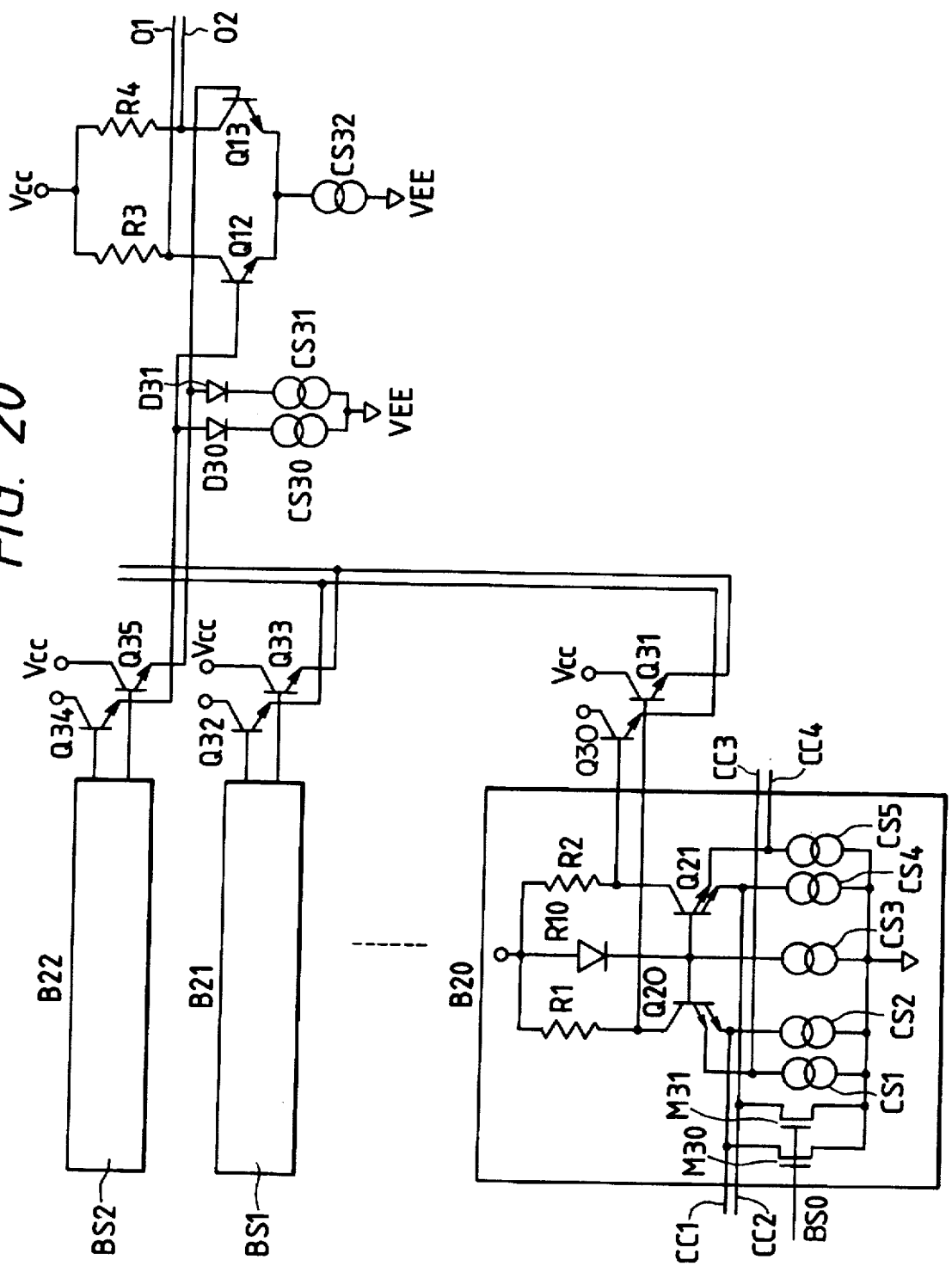
FIG. 20 is a diagram illustrating a part of a memory cell array and sense-up according to another embodiment of the present invention.

Another embodiment of the present invention is shown in FIG. 20. Blocks B20~B22, each is a cascode amplifier such as a multi emitter cascode amplifier, to which one or plural pairs of common collector lines are added. With the present constitution, by rendering the signal line BS0 to "High" level it is possible to lower the output of cascode amplifier B20 below logic "Low" level. Thereby the outputs of the plural cascode amplifiers such as blocks B20, B21, . . . are rendered into a wired OR logic at the emitter follower stage composed of transistors Q30~Q31, diodes D30 and D31 and constant current sources CS30 and CS31 as shown in the drawing. That is, assuming that there are N number of cascode amplifiers, only one of N signal lines from BS0~BSN respectively connected thereto is rendered "Low" level and all of the other signal lines are rendered "High" level, thereby only the output signal of the cascode amplifier in "Low" level is selected and is transferred to the next stage.

The same function is provided by lowering the collectors of Q20 and Q21 with such as MOS, in such case, sometime the collector potentials of Q20 and Q21 decrease below the base potential (which is called to run into saturation). Like the block B20, when the method of lowering the emitter potentials of the multi emitter transistors Q20 and Q21 is employed, there is an advantage no care is needed for the saturation of the multi emitter transistors Q20 and Q21.

Figure 21:
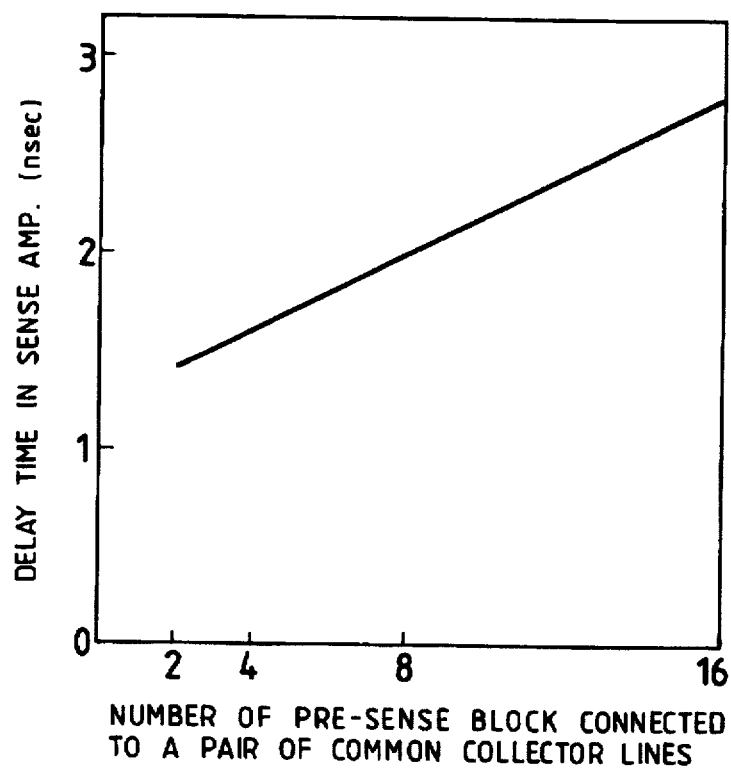
FIG. 21 is a graph illustrating one example of the relationship between the number of presense blocks connected to a pair of common collector lines and the delay time in a sense-up portion.

In FIG. 21 a specific advantage is illustrated when the present embodiment is applied. The abscissa of the graph indicates the number of the presense blocks connected to a pair of common collector lines, and the ordinate thereof indicates the corresponding delay time of the sense amplifier portion. This is a result of computer simulation assuming typical conditions.

As is apparent from FIG. 21, as the number of presense blocks connected to the common collector lines increases, the delay time increases. In the present embodiment the number of presense blocks connected to the common collector lines is reduced from, for example, 16 in a conventional example to 8, thereby a high speed of about 0.8 msec is achieved under the conditions of FIG. 21.

Figure 22:
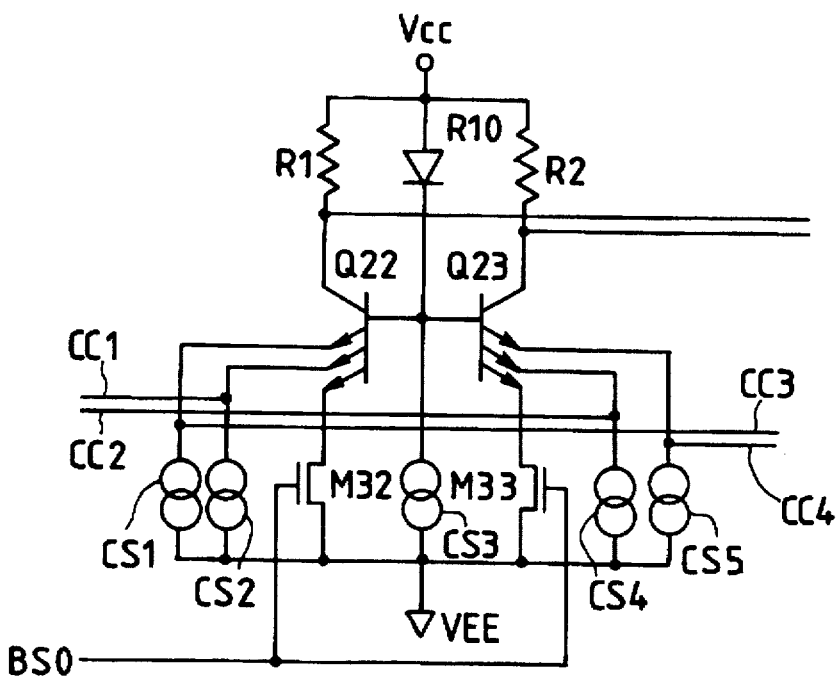
FIG. 22 is a diagram illustrating a part of a sense-up according to still another embodiment of the present invention.

Still another embodiment of the present invention is explained with reference to FIG. 22.

The method of lowering the common collector lines according to the cascode amplifier B20 of FIG. 20 lowers the collector potentials of the transistors Q3 and Q4 of the presense amplifier connected at the forward stage so that the saturation margin of Q3 and Q4 slightly reduces. Further, since the common collector lines having a comparatively large capacitance is driven and the amplitude is small, a recovery time is needed. Accordingly as shown in FIG. 22, the multi emitter transistors Q22 and Q23 are provided with additional emitters which are not connected to the common collector lines CC1~CC4, rather, these additional emitters are used exclusively for pull down and are connected to MOSs M32 and M33 for controlling the selection and non-selection of the cascode amplifiers in accordance with the gate potential of the MOSs M32 and M33.

With the present constitution, the adverse effects such as the saturation of the forward transistors and the recovery time of the common collector lines are eliminated.

Of the symbols in the drawings, ones that begin with M indicate MOS transistors, ones that begin with Q are bipolar transistors, ones that begin with D are diodes, ones that begin with R are load elements such as resistors, ones that begin with CD are common data lines, ones that begin with CC are common collector lines and ones that begin with CS are constant current sources.

The semiconductor device explained above is usually used in a semiconductor memory device; however, such may be used in a microprocessor with a built-in memory device.

According to the above construction, the parasitic capacitance and the parasitic resistance of the common bus lines wherein data multiplexing is carried out are decreased, thereby signal transmission time is reduced and high speed operation of the semiconductor memory device is achieved.

Figure 23:
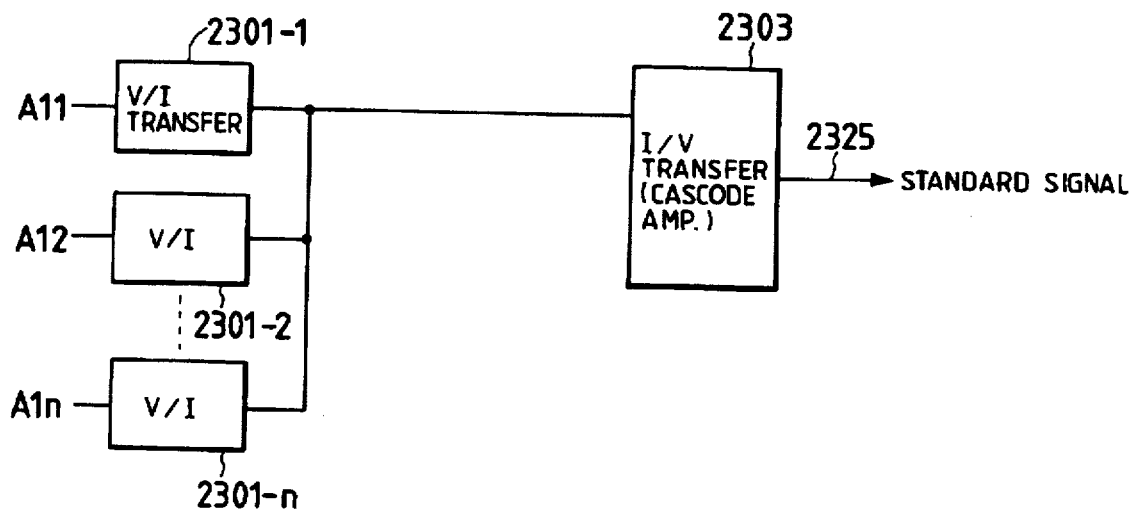
FIG. 23 is a block diagram of an embodiment of a signal change detector circuit according to the present invention.

FIG. 23 shows a block diagram of an embodiment of a signal detector circuit according to the present invention.

The same diagram is formed of n voltage-current (V/I) comparison transition detector circuits 2301-1~2301-n which receive the input signals $A_{1i}$~$A_{1n}$, of which the changes (e.g., leading/trailing edges) are to be detected, and converts them to current pulse signals, and a current-voltage (I/V) converter circuit 2303 which receives these current outputs which are connected in a wired OR connection and converts them again to voltages. The current-voltage converter circuit 2303 is preferably a cascode amplifier.

Figure 24:
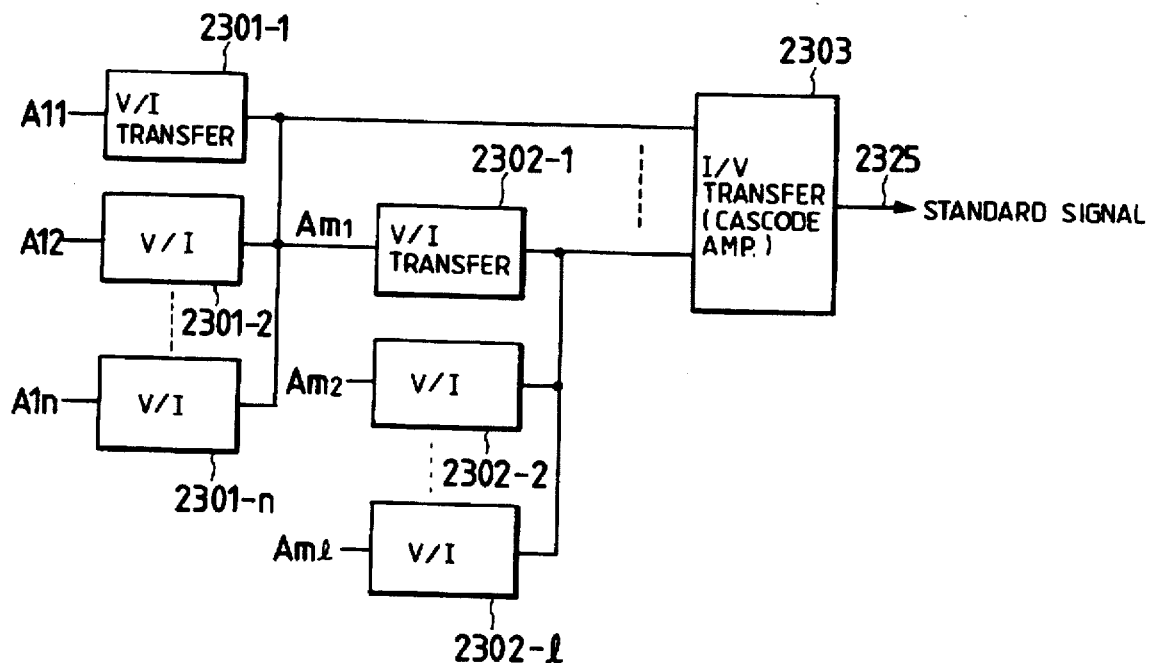
FIG. 24 is a block diagram of another embodiment of a signal change detector circuit according to the present invention.

In FIG. 24, the voltage-current conversion transition detector circuits 2301-1~2301-n which receive the set of the input signals $A_{11}$~$A_{1n}$ of which the changes are to be detected, and the voltage-current conversion transition detector circuits 2302-1~2302-n which receive the set of the other input signals $A_{m1}$~$A_{m1}$ are separately connected as wired OR arrangements, and are connected independently to a current-voltage converter circuit 2303.

Figure 28A:
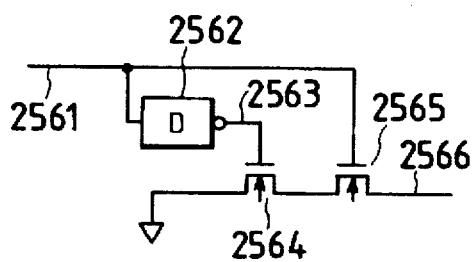
FIGS. 28(a) and 28(b) are explanatory drawings of the construction example and the operation of the voltage-current converter circuit of FIG. 23.
Figure 28B:
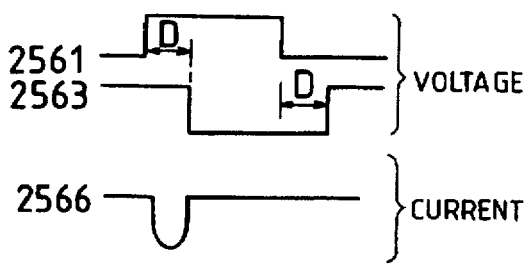
Figure 29A:
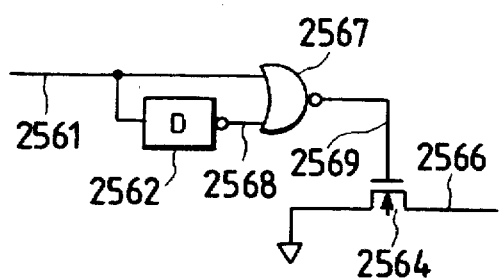
FIGS. 29(a) and 29(b) are explanatory drawings of another example construction and the operation of the voltage-current converter circuit.
Figure 29B:
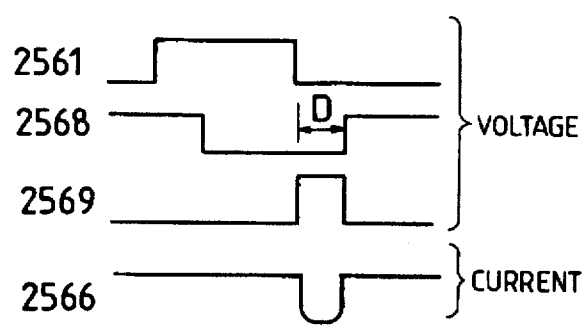

FIGS. 28(a) and 29(a) show a concrete example construction of the voltage-current conversion transition detector circuits 2301 and 2302. FIG. 28 is for detecting the leading edge of the signal, and FIG. 29 is for detecting the trailing edge.

The voltage-current converter circuit of FIG. 28(a) is formed of N channel MOSFETs 2564 and 2565, wherein each drain-source route is connected in series between the current output terminal 2566 and the ground, and a delay circuit 2562 which applies a delayed inverted signal 2563 of input signal 2561 to the gate of FET 2564, and applies the input 2561 to the gate of FET 2565. The delay circuit 2562 can obtain any delay time determined by the propagation delay units of the gate, by connecting the gate circuits in one stage or multiple stages. As shown in the timing diagram of FIG. 28(b), FET 2565 is OFF when the input signal 2561 is low level while FET 2564 is ON. The current is not outputted at this time. Under these conditions, when the input signal 2561 changes to high level, FET 2565 turns ON and coacts with FET 2564 which is still ON, and sends an electric current to the grounding potential. After the input signal 2561 changes to high level, and the delay time of the delay circuit 2562 has elapsed, the gate potential of FET 2564 becomes low level, FET 2564 turns OFF and the electric current is shut down. Therefore, the present circuit generates the current pulse 2566 which has a time span equal to the delay time of the delay circuit 2562 with the timing of the leading edge of the input signal 2561.

The voltage-current converter circuit of FIG. 29(a) is formed of a N channel MOSFET 2564 wherein the drain-source route is connected between the current output terminal 2566 and the ground, a delay circuit 2562 which delays and inverts the input signal 2561, and a NOR gate 2567 which receives the output 2568 and the input signal 2561 of this delay circuit 2562, and applies the output 2569 of this NOR gate 2567 to the gate of FET 2564. As shown in the timing chart of FIG. 29(b), the present circuit outputs a current pulse 2566 which has a time span equal to the delay time of the delay circuit 2562, with the timing of the trailing edge of the input signal 2561.

Figure 30A:
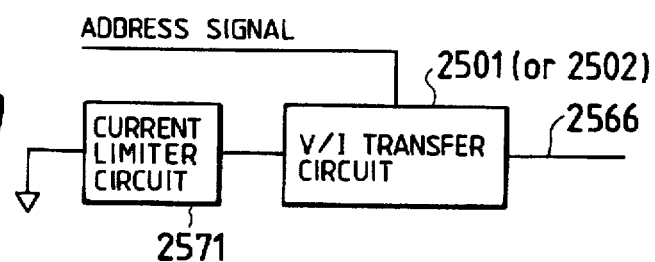
FIG. 30(a) is a block diagram and FIG. 30(b) is a circuit diagram of an improved version of the voltage-current converter circuit.

FIG. 30(a) is an improved version of the voltage-current converter circuit of FIGS. 28(a) and 29(a), to which a current limiter circuit 2571 is added. This current limiter circuit 2571 has a function that limits the current value of the current output to a level which is sufficient to secure the required minimum value of the current output 2566 to operate the current-voltage converter circuit 2303 of the later stage and thereby reducing the power consumption.

Figure 30B:
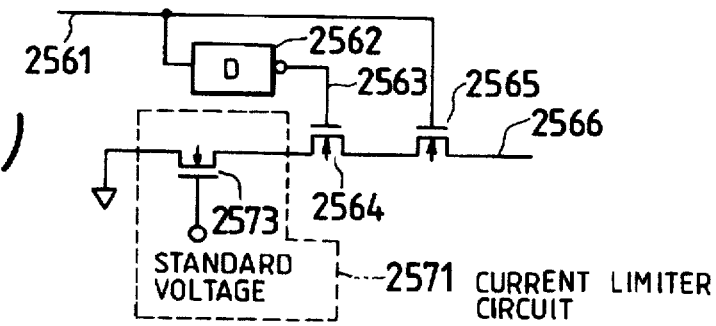

FIG. 30(b) shows an example circuit wherein a current limiter circuit 2571 is added to the voltage-current converter circuit shown in FIG. 28(a). In this example, the current limiter circuit 2571 is composed of a N channel MOSFET 2573 wherein a drain-source path thereof is connected between the FET 2564 and the ground and a reference voltage is applied to the gate.

FIG. 31 shows a concrete circuit example of the current-voltage converter circuit 2303 shown in FIG. 23.

Figure 31A:
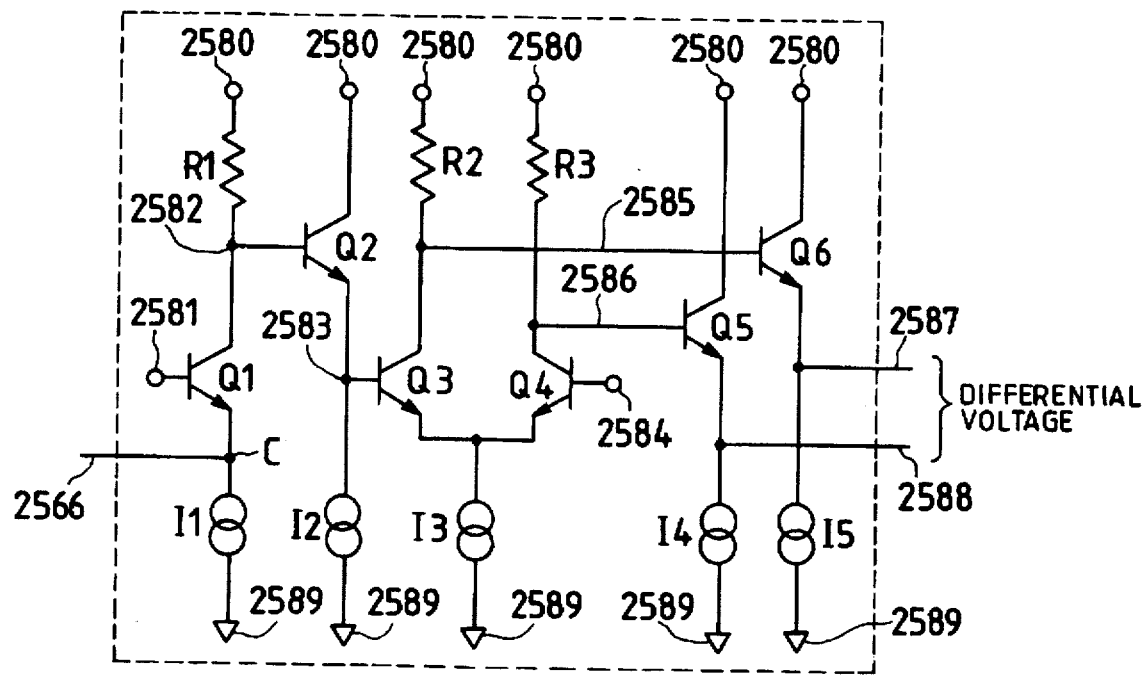
FIGS. 31(a)–31(c) are examples of circuit diagrams of the current-voltage converter circuit.

This current-voltage converter circuit 2303, as shown in FIG. 31(a), is formed of a cascode amplifier Q1 (in this example a grounded base type transistor is used) which takes the current pulse output from the voltage-current converter circuit 2301 (FIG. 23) as its input, and a transistor Q2 which shifts the level of this cascode output 2582, and differential amplifying circuits (transistors Q3 and Q4) which take the level shifted signal 2583 as their input, and emitter follower transistors Q5 and Q6 which shift the levels of these complementary outputs 2585 and 2586, and constant current sources I1~I5 which supply bias currents to each of the above transistors, and load resistances R1~R3, and an electric source terminal 2580, and a grounding terminal 2589. A differential voltage output is obtained from the emitters of the transistors Q5 and Q6.

According to the detector circuit of FIG. 31(a), when a current pulse is derived from the cascode input part (node) C, the collector current of the transistor Q1 increases and is converted to a voltage by the load resistance R1, and its level is shifted by the transistor Q2. It, therefore, can be said at a portion of the detector circuit, a current-to-voltage conversion is effected. This level shifted signal 2583 is compared with the reference signal 2584 by the differential amplifying circuits Q3 and Q4, and is converted to the differential voltages 2585 and 2586. These differential voltages 2585 and 2586 are each level shifted by the transistors Q5 and Q6 and become the output differential voltages 2587 and 2588.

A main characteristic of this circuit is that the electric potential of the cascode input part C is clamped at an almost constant electric potential. In other words, the emitter potential of the transistor Q1 is maintained at a lower voltage than that of the base potential 2581 by the voltage between the base emitters. Because the voltage between the base and emitter of the transistor Q1 is almost constant regardless to the change in the emitter current, and also, because the base voltage 2581 is fixed to a reference potential, the electric potential of the cascode input part C is maintained at substantially constant (the voltage amplitude is several 10 mV). Therefore, even if multiple output lines of the voltage-current converter circuits 2301 and 2302 are connected to the cascode input part C thereby becoming a heavy load, there is no need for each voltage-current converter circuit to drive the cascode input part C with a great voltage amplitude. In other words, the change of the input signal is not transmitted as the change of the voltage level, but is transmitted as the change of the electric current so that the current change is transmitted to the collector of the transistor Q1 at a high speed, and this current change appears in the load resistance as a voltage change. The circuits of the later stages from the transistor Q2 are formed of ECL circuits, which insure a high operating speed.

Figure 31B:
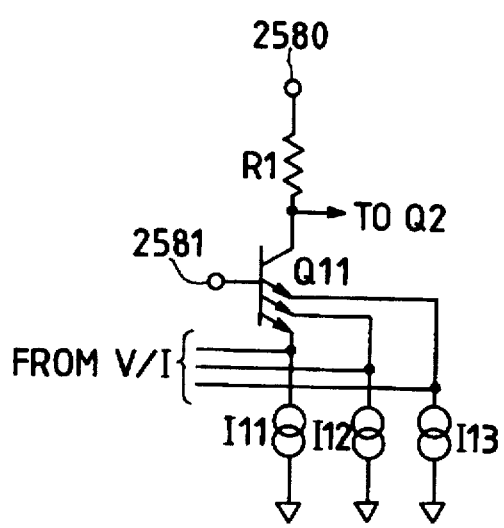

Further, as shown in FIG. 31(b), in order to correspond to the embodiment of FIG. 24, a transistor Q11 having a multi emitter can be adopted as the cascode amplifier, and each current pulse output can be connected to the nodes of each of the emitters and constant current sources $I_{11}$, $I_{12}$ and $I_{13}$. By doing so, the number of the voltage-current converter circuits connected to each emitter of the transistor Q11 is limited, and the maximum change of the electric current is decreased. Therefore, the fluctuation of each emitter potential is further decreased, bringing expectations for a still higher operation speed. This example shows a case with three emitters, but this number is not to be considered as being restricted thereto. Although it is not shown, a plurality of transistors may be used in place of the multi emitter transistor in the same manner.

Figure 31C:
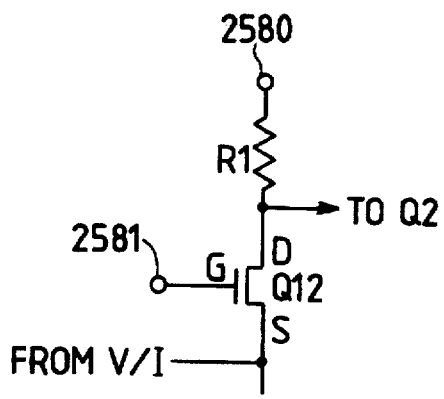

Further as shown in FIG. 31(c), a FET Q12 can be adopted instead of the bipolar transistor Q1.

Next, an embodiment of a semiconductor memory apparatus which utilizes a ATD circuit will be explained.

Figure 25:
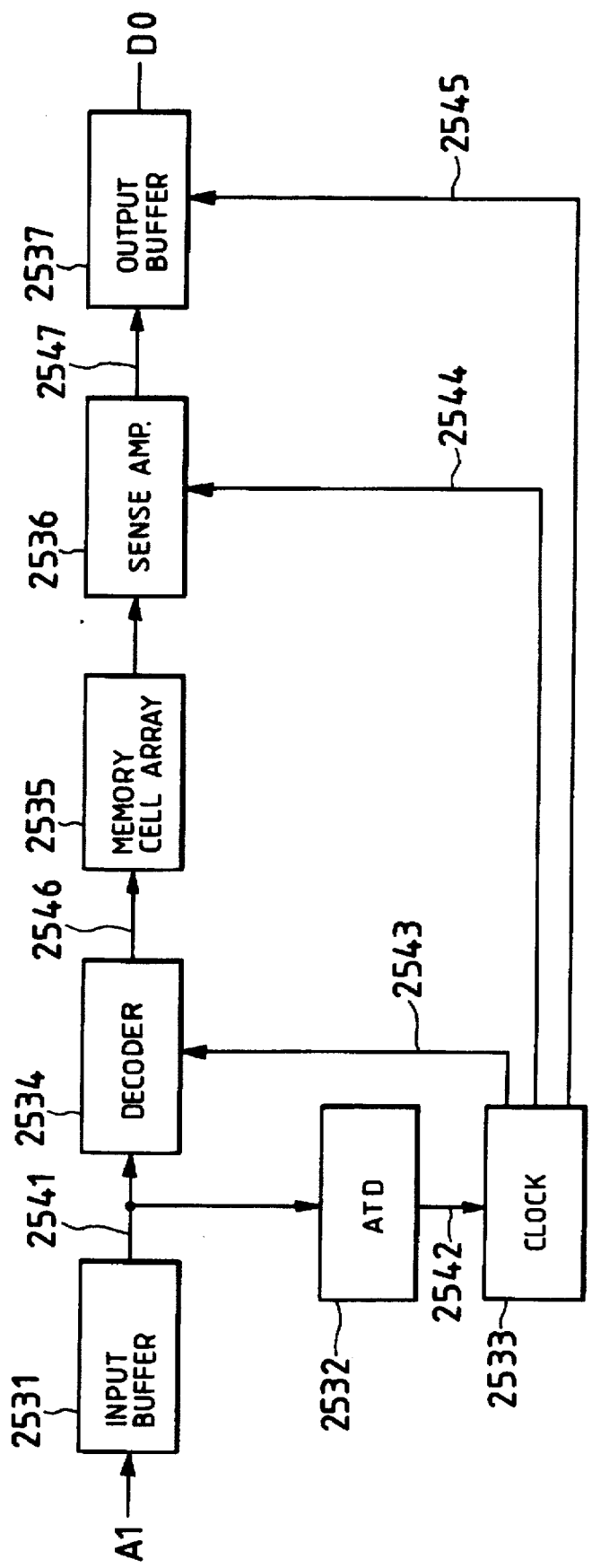
FIG. 25 is a block diagram of a memory apparatus to which the present invention is applied.

FIG. 25 shows a block diagram of the construction of the readout system in the semiconductor memory apparatus. This memory apparatus is formed of an input buffer 2531 which receives the address signal $A_1$, a decoder circuit 2534 which decodes this output address 2541, a memory cell array 2535 wherein a specific cell is indicated by this decoder output 2546, a sense amplifier 2536 which detects and amplifies the output signal of this memory cell array 2535, an output buffer 2537 which outputs this output 2547 as the output data $D_0$, a ATD circuit 2532 which detects the change in the address signal 2541 outputted from the input buffer 2531, and a clock circuit which, in response to this output 2542, generates control signals 2543, 2544 and 2545 for the decoder 2534, the sense amplifier 2536 and the output buffer 2537.

The clock circuit 2533, besides carrying out the timing adjustments between the control signals 2543–2545, carries out the polarity adjustment with receiving units. The control signal 2543 is a signal for word pulse drive and activates the decoder 2534 for a predetermined period after the address has changed, and in the other periods renders the decoder output 2546 a low level and all of the memory cells a nonselective state to decrease of the power consumption (while the memory cell is being selected, a DC current called a cell current, keeps flowing). The control signal 2544 is the equalized signal of the sense amplifier 2536, and as shown in FIG. 26(b), it quickens the establishment of the output of the sense amplifier, by setting the sense amplifier output at the intermediate level before the change. The control signal 2545 is a preset output signal which provides the high operation speed of the output and the reduction of the noise during the operation of the output buffer, by setting the output at the intermediate level before the operation of the output buffer 2537.

Figure 26:
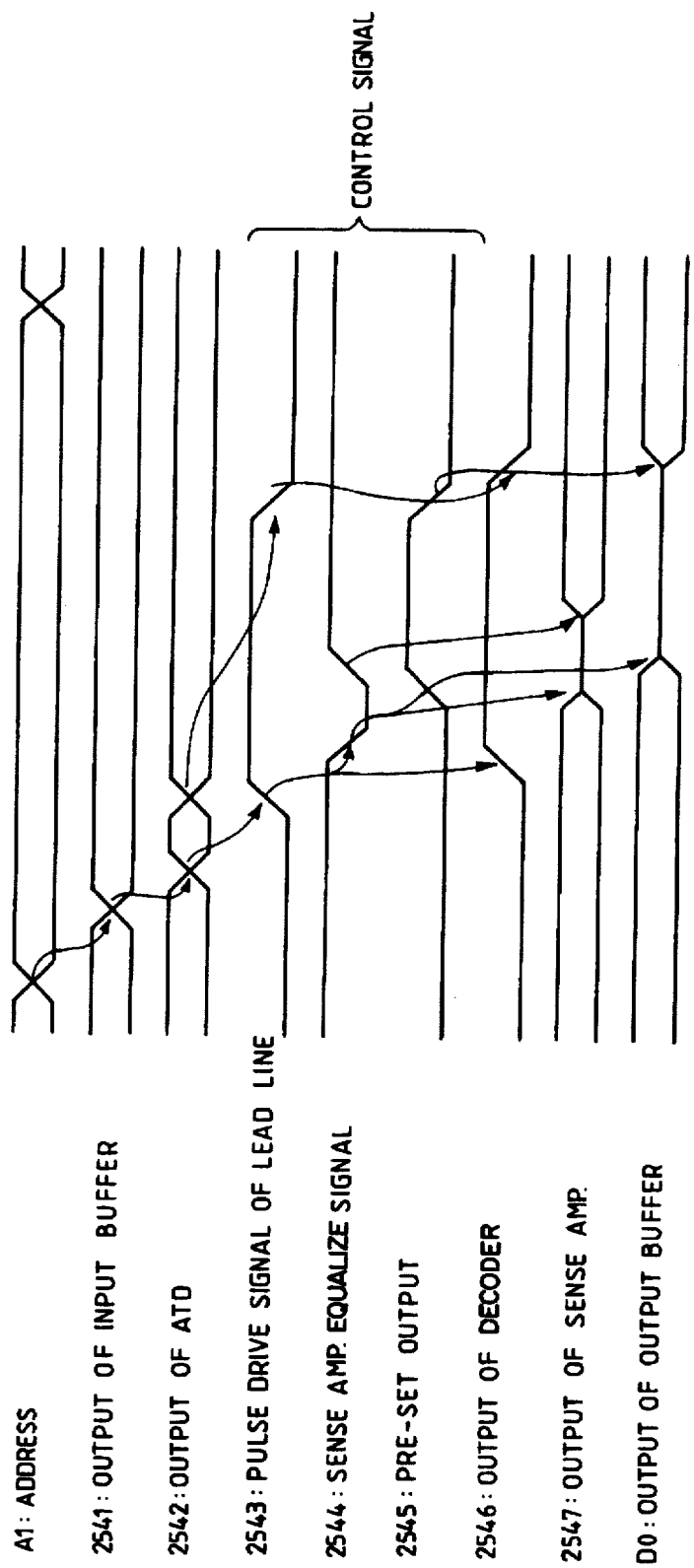
FIGS. 26(a) and 26(b) are operation timing charts of the memory apparatus of FIG. 25.

FIG. 26 shows a timing chart which indicates an example operation of the memory apparatus of FIG. 25.

The change of the address signal Ai is outputted from the input buffer 2541 with a slight delay, and this change is detected by the ATD output 2542, and the ATD output 2542 is generated. In response to this ATD output, the clock circuit 2533 generates the word line pulse driving signal 2543, the sense amplifier equalized signal 2544 and the preset output signal 2545. The decoder 2534 generates the decoder output 2546 in response to the word line pulse driving signal 2543. Meanwhile, after the sense amplifier output 2547 is set to the intermediate level by the sense amplifier equalized signal 2544, the data signal from the memory cell array 2535 is outputted as the sense amplifier output 2547. The output buffer 2537 generates the output $D_0$, after it is set to the intermediate level, in response to the preset output signal 2545.

Figure 27:
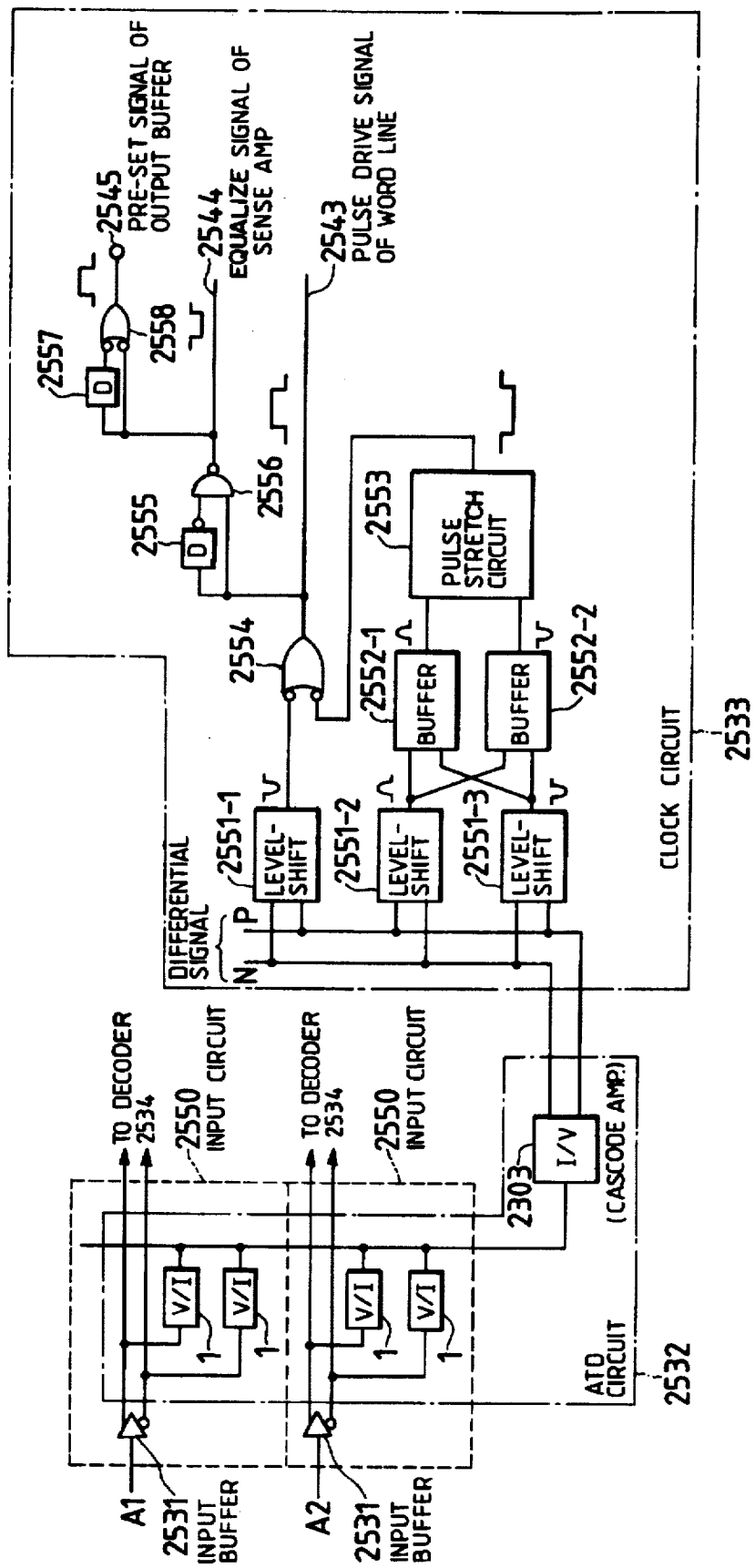
FIG. 27 is a circuit block diagram of the ATD circuit and the clock circuit of the memory apparatus of FIG. 25.

FIG. 27 is a block diagram which shows a concrete construction example of the ATD circuit 2532 and the clock circuit 2533 of FIG. 25.

According to FIG. 27, each input buffer 2531 receives one of the address signals A1, A2 ... and generates a differential output. The leading edge of each differential output is detected by the voltage-current converter circuit 2301 as shown in FIG. 28. The detecting of the leading edge of an inverted output is equivalent to the detecting of the trailing edge of the original signal. Therefore, in this construction, only one of either FIG. 28 or FIG. 29 is used. The two voltage-current converter circuits 2301 which correspond to each input buffer 2531 are arranged on an integration circuit in one unit and constitute the input circuit 2550. The number of the input circuits 2550 will need to be the same as the number of address signals.

The clock circuit 2533 is composed of level converter circuits 2551-1~2551-3 each of which receives the differential output of the current-voltage converter circuit 2330 within the ATD circuit 2532, buffers 2552-1 and 2552-2 which receive both outputs of the level converter circuit 2551-2~2561-2, a pulse stretching circuit 2553 which receives the outputs of both buffers, a negative logic NOR gate (equivalent to a NAND gate) which receives the output of this circuit 2553 and the output of the level converter circuit 2551-1, and generates the word line pulse driving signal 2543, a delay circuit 2555 and a NAND gate 2556 which, in response to this gate output, generates the sense amplifier equalized signal 2544, and further, a delay circuit 2557 and a negative logic NOR gate 2558 which, in response to the gate output, generates the output buffer preset signal 2545. The level converter circuit 2551 is for carrying out the level conversion of the signal so as to match the signal levels of the circuit of the previous stage and the circuit of the later stage. The buffer 2552 is for carrying out the impedance conversion for driving the pulse stretching circuit 2553, and generates a differential signal for the pulse stretching circuit 2553. The pulse stretching circuit 2553 is for stretching the pulse width of the input signal. The logical sum of this negative pulse signal with the stretched pulse width and the negative pulse of the level converter circuit 2551-1 is evaluated by the gate 2554, and is outputted as a positive pulse or the word line pulse driving signal 2543. The significance of evaluating this logical sum is in the fact that by supplementing the leading edge delay of the output pulse of the pulse stretching circuit 2553, the leading edge delay of each of the control signals 2543–2545 is prevented, and shortens the access time of the memory apparatus. The NAND gate 2556 generates a pulse which has the pulse width that is equivalent to the delay time span of the delay circuit 2555, or the sense amplifier equalized signal 2544, while referring to the leading edge of the word line pulse driving signal 2543. The gate 2558 generates a pulse which has a pulse width that is equivalent to the delay time span of the delay circuit 2557, or the output buffer preset signal 2545, while referring to the trailing edge of the sense amplifier equalized signal 2544.

Figure 32:
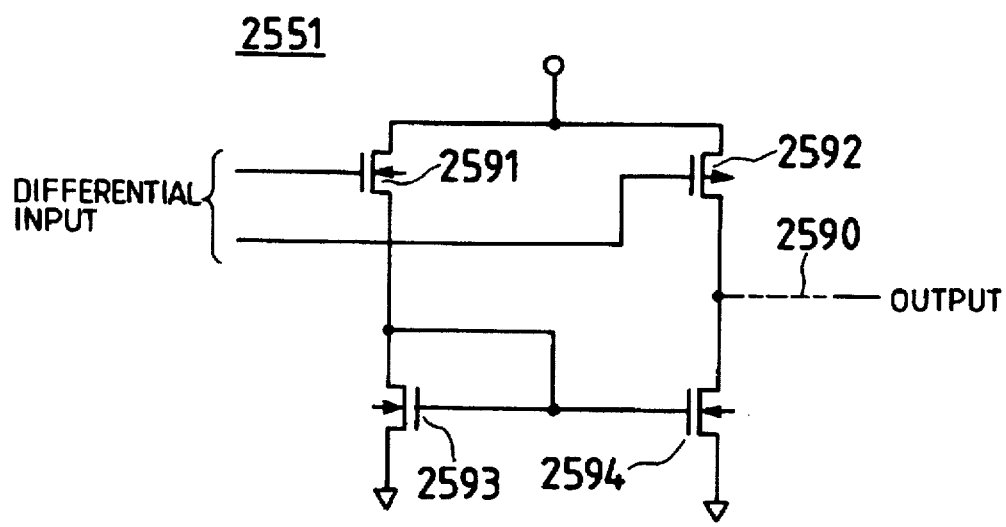
FIG. 32 is a circuit of a concrete example of a level converter circuit within the clock circuit of FIG. 27.

FIG. 32 shows a current mirror type level converter circuit as a concrete example circuit of the level converter circuit 2551 of FIG. 27. This circuit is formed of P channel MOSFETs 2591 and 2592 wherein each gate receives the differential input signal, and N channel MOSFETs 2593 and 2594 which constitutes the current mirror. With this circuit, a differential input circuit with a small amplitude can be converted to the output 2590 with the electric source amplitude.

Figure 33:
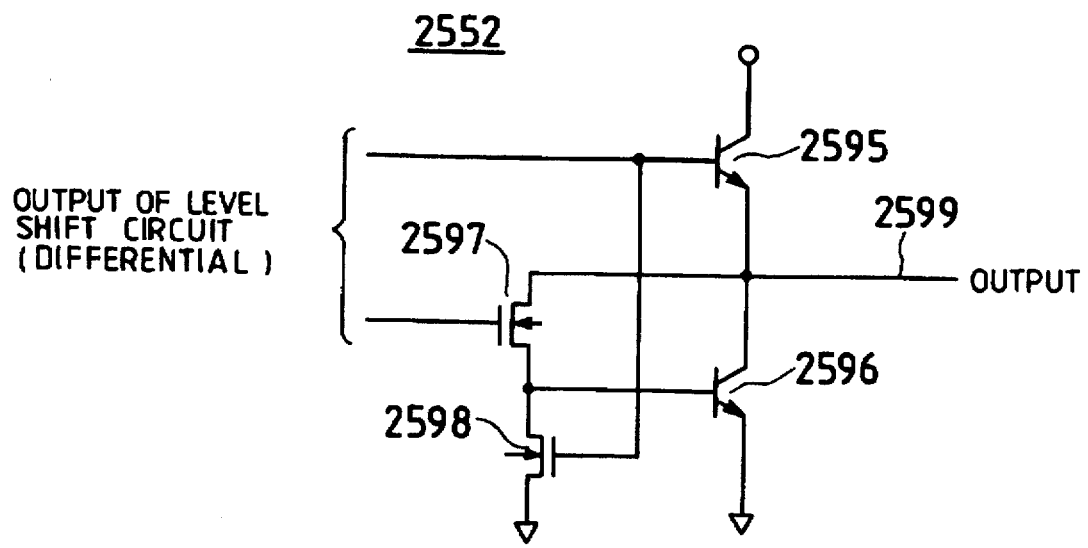
FIG. 33 is a circuit diagram of a concrete example of a buffer circuit within the clock circuit of FIG. 27.

FIG. 33 shows a concrete circuit example of the buffer circuit 2552 of FIG. 27. This circuit is formed of NPN transistors 2595 and 2596 wherein the collector-emitter paths thereof are in a serial connection between the electric source and the ground, and N channel MOSFETs 2597 and 2598 which are in a serial connection between the output 2599 and the ground, wherein one of the differential input signals is applied to the base of the NPN transistor 2595 and the gate of FET 2598, and the other differential input signal is applied to the gate of the FET 2597. With this circuit, the load driving force of the output of the level converter circuit 2551 can be improved.

Next, with FIG. 34, the concrete circuit construction and the operation of the pulse stretching circuit 2553 of FIG. 27 will be explained.

Figure 34A:
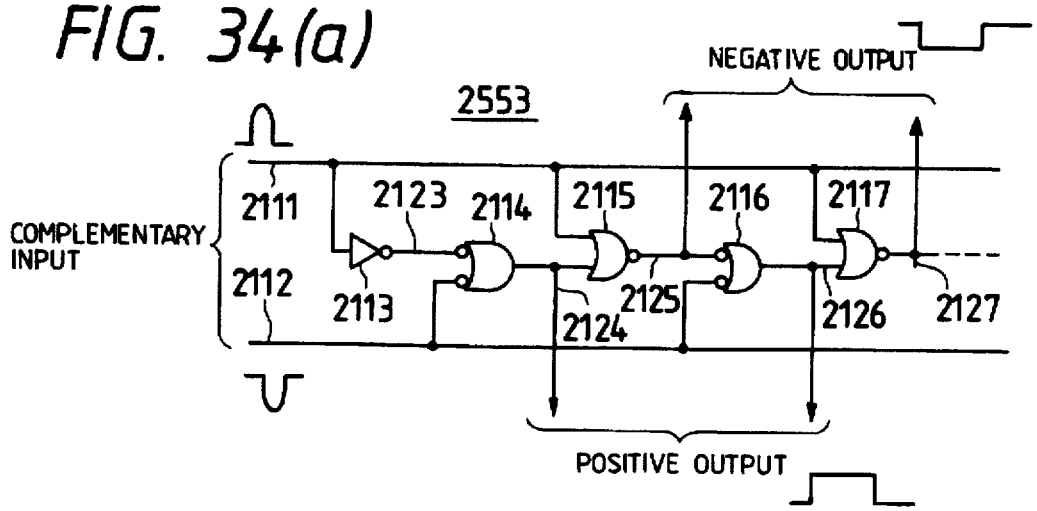
FIGS. 34(a)–34(c) are circuit diagrams and an operation timing chart of a pulse stretching circuit within the clock circuit of FIG. 27.

FIG. 34(a) shows an example construction of the pulse stretching circuit 2553.

This circuit takes the differential input of a pulse signal with a narrow pulse width or the complementary inputs 2111 and 2112 as the input signal, and is for generating an output pulse which has a predetermined pulse width larger than the input pulse, by utilizing the propagation delay of the gate. This circuit is formed of an inverter 2113 which inverts the input 2111, a negative logic NOR gate 2114 which receives this output 2123 and the input 2112, a positive logic NOR gate 2115 which receives this output 2124 and the input 2111, a negative logic NOR gate 2116 which receives this output 2125 and the input 2112, and a positive logic NOR gate 2117 which receives this output 2126 and the input 2111.

Figure 34B:
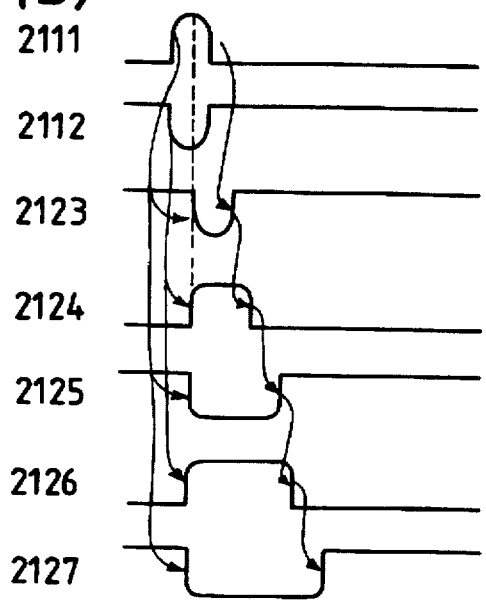

As shown in the timing chart of FIG. 34(b), this circuit consecutively stretches the pulse width by evaluating the logical sum of the delay pulse and the original pulse 2111 or 2112. A posi (positive) pulse output can be obtained form the outputs 2124 and 2126, and a nega (negative) pulse output can be obtained from outputs 2125 and 2127. The pulse width becomes greater for the outputs of later stages. There is a predetermined rule to this construction, and by following this rule, a pulse stretching circuit with a desired number of stages can be constructed.

In prior pulse stretching circuits, a complementary input was not used, and only one input (for example, input 2111) was used, and inverters were used instead of the gates 2114 and 2116. Therefore, the minimum unit of the delay time was for two gates, and a narrow-pulse that did not fulfill this time span could not be stretched. Because a complementary input is utilized in the present invention, the minimum unit of the delay time is for one gate, and the stretching of the pulse width becomes possible for a pulse that has this time span at least.

Figure 34C:
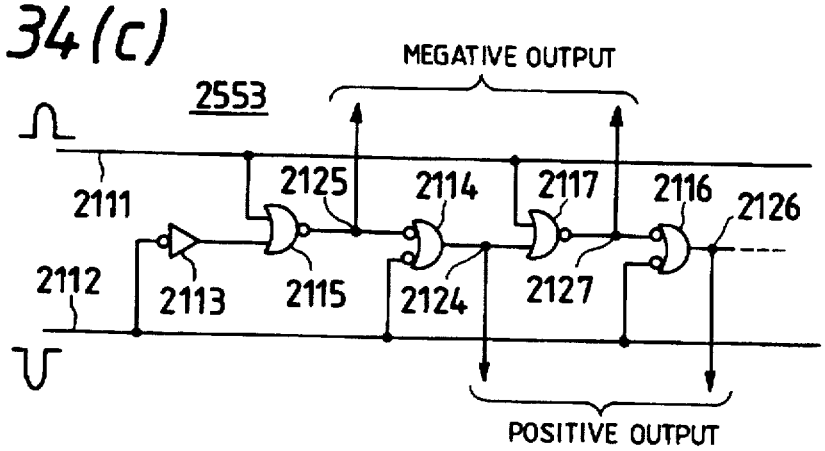

FIG. 34(c) shows a modification of the pulse stretching circuit of (a) of the same diagram. In this circuit, the order of the negative logic NOR gates 2114 and 2116, and the positive logic NOR gates 2115 and 2117 are exchanged. In accompany to this, the input of the inverter 2113, is taken from the input 2112 on the different side from one input of the gate 2115.

With the above construction, because the voltage change of the signal is once converted to a current, and after evaluating the logical sum in the current level while limiting small the voltage amplitude of the heavy load part, it is converted again to a voltage change, the effect of the heavy load is removed, and the signal change detection with high speed becomes possible. Also, by utilizing this signal change detector circuit for the ATD circuit of a memory apparatus, the access time can be shortened.

Figure 40:
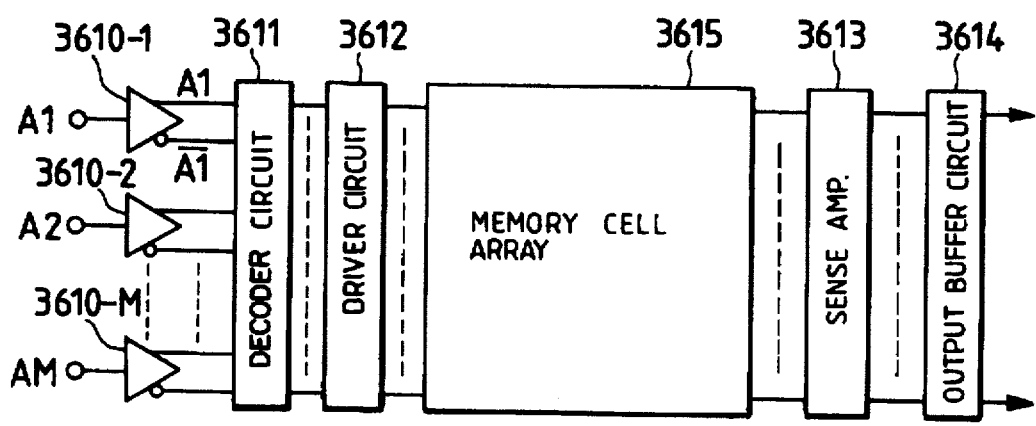
FIG. 40 is an overall drawing of a memory apparatus to which the present invention is applied.

FIG. 40 shows a block diagram of a semiconductor memory. Each of 3610-1, 3610-2, and 3610-M in the figure is an input buffer circuit, and each input includes a non-inverted output and an inverted output. 3611 is a decoder circuit, 3612 is a driver circuit, which assigns an address to memory array 3615. 3613 is a sense amplifier, and 3614 is an output buffer circuit.

FIG. 36 is a block diagram that shows an embodiment of the present invention for the output Buffer circuit. In the same figure there is a sense circuit 3621, of which a non-inverted signal D and an inverted signal $\overline{D}$ of the output is to be applied to a level converter circuit 3622. Each output of this level converter circuit 3622 is to be applied to the base of a bipolar transistor $Q_1$, and the gate of a MOS transistor $Q_2$. Electric source Vcc is to be supplied to the collector of the said bipolar transistor, the source of the MOS transistor $Q_2$ is grounded and from the nodes of the bipolar transistor and the MOS transistor, output OUT is taken and connected to an outer load 3626. On the other hand, there is a transition detector circuit 3623, which outputs an output signal TD which is based on the input signal, and this output signal is to be applied to each gate of MOS transistors $Q_3$ and $Q_4$. The drain of said MOS transistor Q3 is connected to the base of the said bipolar transistor $Q_1$, and the source is grounded. Also the drain of said MOS transistor Q4 is connected to the gate of said MOS transistor Q4, and the source is grounded.

Further, the output of said transition detector circuit 3623 is to be applied to a level 1 generator circuit 3624 and a level 2 generator circuit 3625, and the output of each of these circuits is to be applied to the output of the output buffer circuit which is connected to said outer load 3626.

In such a circuit, explained in detail, bipolar transistor $Q_1$ and MOS transistor $Q_2$ are driving transistors that drive the outer load to "H" level and "L" level, respectively, where the bipolar transistor $Q_1$ is formed of a npn bipolar transistor, and MOS transistor a n channel MOS transistor. And parallel to this output buffer transistor arrangement, consisting of the bipolar transistor $Q_1$ and the MOS transistor $Q_2$, the level 1 generator circuit 3624 for setting the output to an electric potential level 1, and the level 2 generator circuit 3625 for setting the output to an electric potential level 2, are connected. The MOS transistors $Q_2$ and $Q_4$ are for inactivating the output buffer driving transistors $Q_1$ and $Q_2$, and are connected to the base of the bipolar transistor $Q_1$ and the gate of the MOS transistor $Q_2$, respectively. And in the transition detector circuit 3623, the change of address input signal (A) is detected and a detector signal having a predetermined pulse amplitude (TD signal) is constructed, and this signal is sent to the level 1 generator circuit 3624, the level 2 generator circuit 3625 and the MOS transistors $Q_3$ and $Q_4$. The level 1 generator circuit 3624 and the level 2 generator circuit 3625 are driven by the TD signal and the output terminal voltage. The level 1 generator circuit is driven by a TD signal when the output terminal voltage is "L" and raises the output terminal to the electric potential level 1. The level 2 generator circuit 3625 is driven by a TD signal when the output terminal voltage is "H" and lowers the output terminal to the electric potential level 2. Further, when either one of the bipolar transistor $Q_1$ and the MOS transistor $Q_2$ of the output buffer circuit, is in a conducting state when the level 1 generator circuit 3624 or the level 2 generator circuit 3625 is being driven by a TD signal, because of the charge through these transistors, the transition to the level 1 or the level 2 is hindered. Therefore, while the level 1 generator circuit 3624 or the level 2 generator circuit 3625 is being driven, a TD signal is sent to the MOS transistor $Q_3$ and $Q_4$ as well, and forces the MOS transistor Q2 to become non-conductive. After a predetermined time, the TD signal is rendered to "L", and the true data that is emitted from the sense circuit 3621, through the level converter circuit 3622, drives the bipolar transistor $Q_1$ and the MOS transistor $Q_2$ of the output buffer circuit and moves the output terminal to a desired level.

Figure 37:
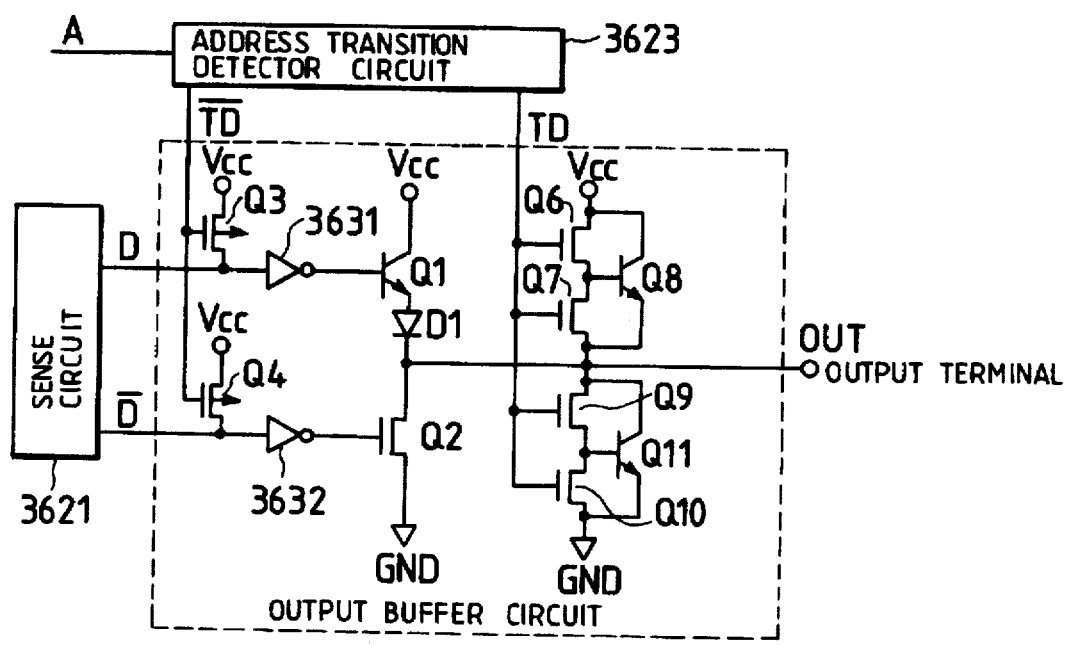
FIG. 37 is a block diagram that shows another embodiment of an output buffer circuit according to the present invention.

FIG. 37 is a block diagram that shows another embodiment of an output buffer circuit. The present embodiment materializes the level converter circuit 3622, the level i generator circuit 3624 and the level 2 generator circuit 3625 in FIG. 36. In the present embodiment, the level converter circuit 3622 consists of an inverter circuit, and because of the "H" level relation of the TTL standard, diode $D_i$ is included in the output buffer transistor. The MOS transistors $Q_3$ and $Q_4$, which are for inactivating the output buffer transistors, are inserted to the input side of level conversion stage inverters 3631 and 3632, and each is constituted of a P channel MOS transistor. The level 1 generator circuit 3624 shown in FIG. 36 is constituted of two MOS transistors $Q_6$ and $Q_7$, and a clamp circuit using a bipolar transistor $Q_8$. The level 2 generator circuit 3625 of FIG. 36 similarly is constituted of two MOS resistors $Q_9$ and $Q_{10}$ and a clamp circuit using a bipolar transistor $Q_{11}$.

Here, the operation of the level 1 generator circuit, which consists of the MOS resistors $Q_6$ and $Q_7$ and the bipolar transistor $Q_8$, is explained. First, assuming a case where the output terminal is an 0 V, the MOS resistors $Q_6$ and $Q_7$ are turned ON by the input of a TD signal, and the base potential of the bipolar transistor $Q_8$ starts to increase. Next, when the voltage that is applied to both ends of the MOS resistor $Q_7$ increases up to nearly 0.8V, the bipolar transistor $Q_8$ is turned ON, a large current flows from the electric source to the output terminal and charges the load capacitance. Thereby the output voltage starts to increase. This circuit is constructed to drive the bipolar transistor $Q_8$ by means of the voltage between the source and drain of the MOS resistance $Q_7$, but in the case where the base current for driving the bipolar transistor $Q_8$ is sufficiently small, the voltage between the source-drain of this MOS resistor $Q_7$ is determined by the potential difference of the source voltage and the output terminal voltage, and the ratio of the ON resistances of the MOS resistors $Q_6$ and $Q_7$. Therefore, when the output terminal voltage increases, and the potential difference of the source voltage and the output terminal voltage goes below a predetermined value, the voltage between the source-drain of the MOS resistor $Q_7$ decreases, the bipolar transistor $Q_8$ becomes non-conductive, and the rise of the output terminal voltage comes to a halt. Thus, only in the case where the TD signal is in a "H" state, and more than a predetermined voltage is applied to the source and the output terminal voltage, the level 1 generator circuit consisting of the MOS resistors $Q_6$ and $Q_7$ and the bipolar transistor $Q_8$ operates as a clamp circuit wherein the bipolar transistor $Q_8$ is operable. A level 2 generator circuit, which consists of MOS resistors $Q_9$ and $Q_{10}$ and bipolar transistor $Q_{11}$, also operates under the exact same principle as the level 1 generator circuit. Therefore, only in the case where the TD signal is in a "H" state, and more than a predetermined voltage is applied between the output terminal and the ground, the level 2 generator circuit operate, as a clamp circuit where the bipolar transistor $Q_{11}$ is operable.

As it is clear from the above explanation, in the case where the output terminal is "Low" when the TD signal becomes "H", the level 1 generator circuit 3624 raises the output terminal to a predetermined voltage, and in the case where the output terminal is "High", the level 2 generator circuit 3625 lowers the output terminal to a predetermined voltage.

The clamp voltage of the level 1 generator circuit which consists of the MOS resistors $Q_6$ and $Q_7$ and the bipolar transistor $Q_8$, is set by choosing the MOS size ratio of the MOS resistors $Q_6$ and $Q_7$. Also, similarly, the clamp voltage of the level 2 generator which consists of the MOS resistors $Q_9$ and $Q_{10}$ and the bipolar transistor $Q_{11}$, is set by choosing the MOS size ratio of the MOS resistors $Q_9$ and $Q_{10}$.

Thus, a time chart is shown in FIG. 35, in which the output signal of an output buffer circuit constructed as in FIG. 36 or FIG. 37, is shown by the relation of the transition detector signal (TD) and the input signal (IN). As it is clear from FIG. 35(C), although the output signal takes the mean value, during the transition from "L" level to "H" level, the output of "Level 1", near to "L" level which is set by the clamp voltage of said level 1 generator circuit 3624 is sent out.

Also, during the transition from "H" level to "L" level the output of "Level 2" near to "H" level, which is set by the clamp voltage of said level 2 generator circuit 3625 is sent out.

Therefore, because the electric potential of said "Level 1" or "Level 2" is set at an electric potential apart from the input threshold voltage ($V_{th}$) of other LSIs which are assembled into the same semiconductor chip, there will be no adverse influences to the other LSIs.

Figure 38:
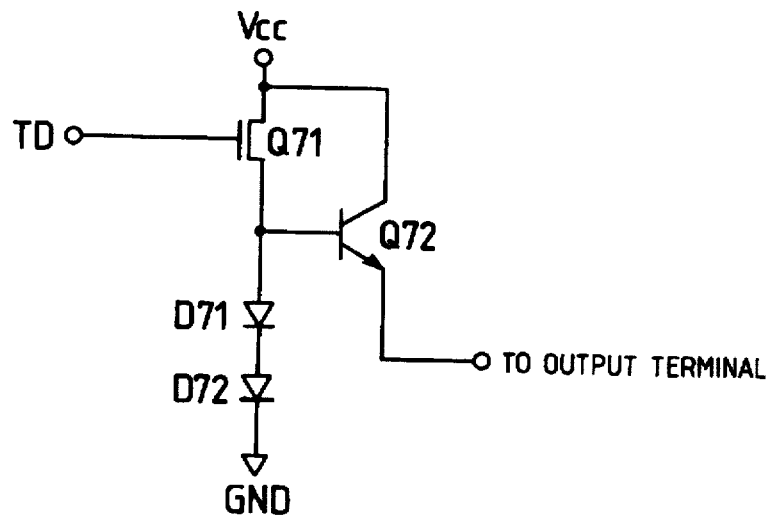
FIG. 38 is a block diagram that shows another embodiment of a level 1 generator circuit of an output buffer circuit according to the present invention.

Next, FIG. 38 is a block diagram that shows another embodiment of said level 1 generator circuit 3624. A MOS transistor $Q_{71}$ and diodes $D_{71}$ and $D_{72}$ are connected between the electric source Vcc and the ground, and a TD signal is to be applied to the gate of said MOS transistor $Q_{71}$. The output of the nodes of said MOS transistor $Q_{71}$ and the diode $D_{71}$ is to be applied to the base of a bipolar transistor $Q_{72}$, and said electrical source Vcc is supplied to the collector of this bipolar transistor $Q_{71}$, and also an output is to be emitted from the emitter.

This circuit consists of the bipolar transistor $Q_{72}$ and the MOS transistor $Q_{71}$, which controls the drive of this $Q_{72}$, and diodes $D_{71}$ and $D_{72}$. The MOS transistor $Q_{71}$ turns ON when it receives the "H" of a TD signal, but at this time, because it generates a predetermined voltage (about 0.8V) between the terminals of the diodes $D_{71}$ and $D_{72}$, in the case where the output terminal voltage is close to the ground voltage, a forward voltage (about 1.6V) is applied between the base-emitter of the bipolar transistor $Q_{72}$, and the bipolar transistor $Q_{72}$ will continue to flow the electric current until the output terminal voltage increases up to about 0.8V. A feature of this circuit is in its ability to construct a level 1 generator circuit with a stable electric potential that is determined by the forward voltage of the diodes $D_{71}$ and $D_{72}$ and the bipolar transistor $Q_{72}$.

Figure 39:
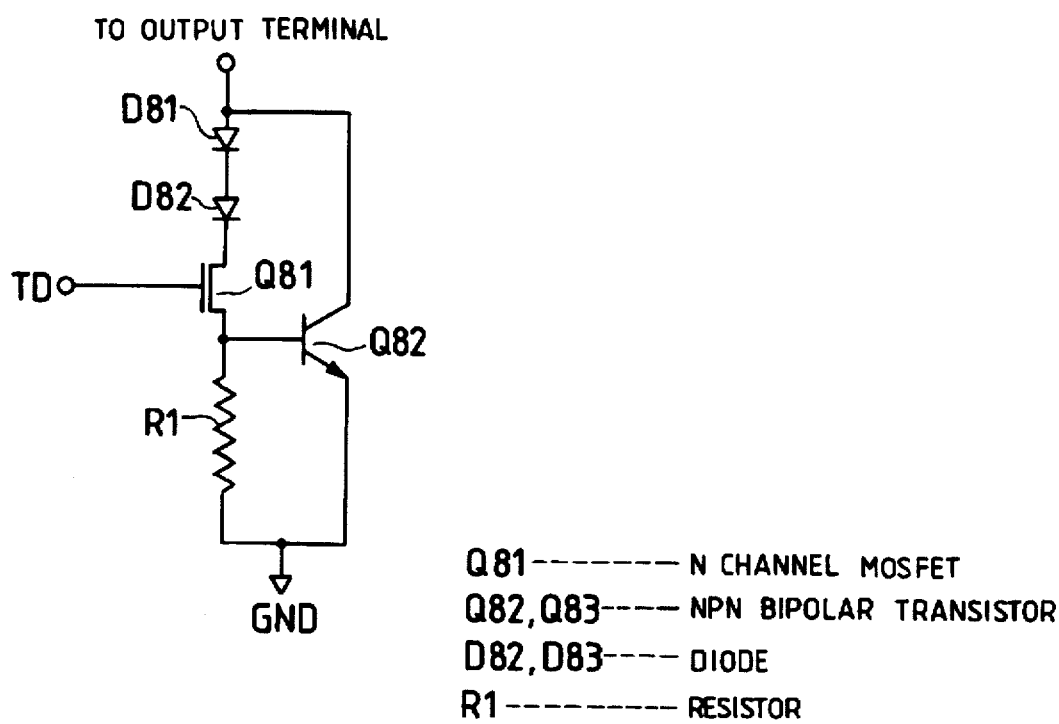
FIG. 39 is a block diagram that shows another embodiment of a level 2 generator circuit of an output buffer circuit according to the present invention.

Further, FIG. 39 is a block diagram that shows another embodiment of the level 2 generator circuit 3625. Diodes $D_{81}$ and $D_{82}$, a MOS transistor circuit $Q_{81}$ and a resistor $R_1$ are serially connected, from the said output terminal side, between the output terminal and the ground, and a TD signal is to be applied to the gate of said MOS transistor $Q_{81}$. Also a bipolar transistor $Q_{82}$ is connected between the said output terminal and the ground, and to that base, the output from the nodes of said MOS transistor $Q_{81}$ and the resistor $R_1$ is to be applied.

This circuit, in the case where the MOS transistor $Q_{81}$ turns ON when it receives the "H" of a TD signal, correspondingly generates a predetermined voltage (about 0.8V) between the terminals of the diodes $D_{81}$ and $D_{82}$. Therefore, in the case where the output terminal voltage is High and over 2.4V, a forward voltage over 0.8V is applied to the base of the bipolar transistor $Q_{82}$. Thus the bipolar transistor $Q_{82}$ continues to flow the electric current from the electric source to the output terminal until the output terminal voltage decreases to nearly 2.4V. A feature of this circuit is in its ability to construct a level 2 generator circuit with a stable electric potential that is determined by the forward voltage of the diodes $D_{81}$ and $D_{82}$ and the bipolar transistor $Q_{82}$.

As it is clear from the above explanation, with the output buffer circuit, it is possible to obtain one that has a high operating speed, and a low noise, as well as eliminates adverse influence on the other circuits.

We claim:

1. A signal transition detector circuit comprising:
    an input circuit for receiving an input signal of a voltage amplitude and outputting a current amplitude signal in response to a change in level of the input signal; and
    a detection circuit connected with said input circuit and comprising a cascode amplifier having an input node coupled to receive the current amplitude signal from said input circuit, the input node of said cascode amplifier being maintained at a substantially constant voltage,
    wherein said detection circuit is adapted to detect a transition of the current amplitude signal and, in response thereto, generates an output signal of a voltage amplitude.

2. A signal transition detector circuit according to claim 1, wherein said cascode amplifier receives the current amplitude signal from said input circuit and generates a voltage in response thereto, and
    wherein said detection circuit further comprises an emitter-coupled logic (ECL) circuit for generating an output signal of a voltage amplitude in accordance with the voltage generated at an output of said cascode amplifier.

3. A signal transition detector circuit according to claim 1, wherein said cascode amplifier receives the current amplitude signal from said input circuit and generates a current, and
    wherein said detection circuit further comprises an emitter-coupled logic (ECL) circuit, coupled to said cascode amplifier, and for generating an output signal of a voltage amplitude in accordance with the generated current.

4. A signal transition detector circuit according to claim 1, wherein said cascode amplifier receives the current amplitude signal from said input circuit and converts the current amplitude signal received to a voltage, and
    wherein said detection circuit further comprises an emitter-coupled logic (ECL) circuit, coupled to said cascode amplifier, for generating an output signal of a voltage amplitude in accordance with the converted voltage.

5. A signal transition detector circuit according to claim 1, wherein said cascode amplifier receives the current amplitude signal from said input circuit and generates a current, and
    wherein said detection circuit further comprises an emitter-coupled logic (ECL) circuit which converts the generated current, from said cascode amplifier, to a voltage and which generates an output signal of a voltage amplitude based on the converted voltage.

6. A signal transition detector circuit according to claim 1, wherein said input circuit is adapted to detect a leading edge transition of the input signal.

7. A signal transition detector circuit according to claim 1, wherein the input circuit comprises a delay circuit and a switching circuit, said delay circuit receiving, at an input thereof, the input signal of the voltage amplitude and providing, at an output thereof, a delayed logical invert of the input signal, and said switching circuit including (1) a first switching element for receiving the delayed logical invert signal and, in response thereto, controlling a flow of a current and (2) a second switching element for receiving the input signal and, in response thereto, controlling a flow of a current.

8. A signal transition detector circuit according to claim 7, further comprising a current limiter circuit controlling a level of current flow through said switching circuit according to a control signal provided to said current limiter circuit from another circuit.

9. A signal transition detector circuit according to claim 7, further comprising a third switching element receiving a control signal provided from another circuit and for controlling a level of current flow through said switching circuit according to the control signal received.

10. A signal transition detector circuit according to claim 1, wherein said input circuit is adapted to detect a trailing edge transition of the input signal.

11. A signal transition detector circuit according to claim 1,
    wherein the input circuit comprises:
        a delay circuit for receiving, at an input thereof, the input signal of the voltage amplitude and providing at an output thereof, a delayed logical invert of the input signal;
        a NOR gate having one input for receiving the input signal and another input for receiving the delayed logical invert signal, and an output for providing a result of a logical NOR operation; and
        a first switching element coupled to receive the result from the output of said NOR gate and, in response thereto, controlling a flow of a current.

12. A signal transition detector circuit according to claim 11, further comprising a current limiter circuit for controlling the flow of a current through said first switching element according to a control signal provided to said current limiter circuit from another circuit.

13. A signal transition detector circuit according to claim 11, further comprising a second switching element receiving a control signal provided from another circuit and for controlling the flow of a current through said first switching element according to the control signal.

14. A signal transition detector circuit according to claim 1, wherein the output signal of said detection circuit is a single voltage signal.

15. A signal transition detector circuit according to claim 1, wherein the output signal of said detection circuit is a differential voltage signal.

16. A signal transition detector circuit comprising:
    plural input circuits each of which receiving an input signal of a voltage amplitude and outputting a current amplitude signal in response to a change in level of the input signal thereof; and
    a detection circuit connected with each of the input circuits and comprising a cascode amplifier, said cascade amplifier receiving the current amplitude signals at an input node thereof, the input node of said cascode amplifier being maintained at a substantially constant voltage,
    wherein said detection circuit is adapted to detect a transition of at least one of the current amplitude signals and, in response thereto, generates an output signal of a voltage amplitude.

17. A signal transition detector circuit according to claim 16, wherein said cascode amplifier comprises a multi-emitter bipolar transistor having a plurality of emitters in which a voltage at each of the emitters and a base voltage are maintained substantially constant, thereby permitting connection of the emitters with the plurality of input circuits.

18. A signal transition detector circuit according to claim 16, wherein said cascode amplifier comprises a plurality of bipolar transistors each of which having an emitter voltage and a base voltage maintained substantially constant, thereby permitting connection of the bipolar transistors with the plurality of input circuits.

19. A signal transition detector circuit according to claim 16, wherein said cascode amplifier comprises a plurality of field effect transistors each of which having a gate voltage and a source voltage maintained substantially constant, thereby permitting connection of the field effect transistors with the plurality of input circuits.

20. A signal transition detector circuit according to claim 16, wherein said cascode amplifier receives the current amplitude signal from the input circuits and generates a voltage in response thereto; and wherein said detection circuit further comprises an emitter-coupled logic (ECL) circuit for generating an output signal of a voltage amplitude based on the generated voltage at an output of said cascode amplifier.

21. A signal transition detector circuit according to claim 16, wherein said cascode amplifier receives the current amplitude signal from the input circuits and generates a current, and wherein said detection circuit further comprises an emitter coupled logic (ECL) circuit, coupled to said cascode amplifier, and for generating an output signal of a voltage amplitude in accordance with the generated current.

22. A signal transition detector circuit according to claim 16, wherein said cascode amplifier receives the current amplitude signal from the input circuits and converts the current amplitude signal received to a voltage, and wherein said detection circuit further comprises an emitter-coupled logic (ECL) circuit, coupled to said cascode amplifier, for generating an output signal of a voltage amplitude in accordance with the converted voltage.

23. A signal transition detector circuit according to claim 16, wherein said cascode amplifier receives the current amplitude signal from the input circuits and generates a current, and wherein said detection circuit further comprises an emitter-coupled logic (ECL) circuit for converting the generated current, from said cascode amplifier, to a voltage and generating an output signal of a voltage amplitude based on the converted voltage.

24. A signal transition detector circuit according to claim 16, wherein said plurality of input circuits are adapted to detect a transition of a leading edge of the input signals applied thereto, respectively.

25. A signal transition detector circuit according to claim 16, wherein each of the input circuits comprises a delay circuit and a switching circuit, said delay circuit receiving, at an input thereof, the input signal of the voltage amplitude and providing, at an output thereof, a delayed logical invert of the input signal, and said switching circuit including (1) a first switching element for receiving the delayed logical invert signal and, in response thereto, controlling a flow of a current, and (2) a second switching element for receiving the input signal and controlling a flow of a current according to a logical level of the input signal.

26. A signal transition detector circuit according to claim 25, further comprising a current limiter circuit for controlling a level of current flow through said switching circuit according to a control signal provided to said current limiter circuit from another circuit.

27. A signal transition detector circuit according to claim 25, further comprising a third switching element for receiving a control signal provided from another circuit and controlling a level of current flow through said switching circuit according to the control signal received.

28. A signal transition detector circuit according to claim 16, wherein said plurality of input circuits are adapted to detect a transition of a trailing edge of the input Signals applied thereto, respectively.

29. A signal transition detector circuit according to claim 16, wherein each of the input circuits comprises:

a delay circuit for receiving, at an input thereof, the input signal of the voltage amplitude and providing at an output thereof, a delayed logical invert of the input signal;

a NOR gate having one input for receiving the input signal, another input for receiving the delayed logical invert signal, and an output for providing a result of a logical NOR operation; and a first switching element coupled to receive the result from the output of said NOR gate and, in response thereto, controlling a flow of a current.

30. A signal transition detector circuit according to claim 29, further comprising a current limiter circuit for controlling the flow of a current through said first switching element according to a control signal provided to said current limiter circuit from another circuit.

31. A signal transition detector circuit according to claim 29, further comprising a second switching element for receiving a control signal provided from another circuit and controlling the flow of a current through said second first switching element according to the control signal.

32. A signal transition detector circuit according to claim 16, wherein the output signal of said detection circuit is a single voltage signal.

33. A signal transition detector circuit according to claim 16, wherein the output signal of said detection circuit is a differential voltage signal.

34. An address transition detector circuit comprising:

plural input circuits each of which receiving an address signal of a voltage amplitude and outputting a current amplitude signal in response to a change in level of the address signal thereof; and a detection circuit connected with each of the input circuits and comprising a cascode amplifier, said cascode amplifier receiving the current amplitude signals at an input node thereof, the input node of said cascode amplifier being maintained at a substantially constant voltage, wherein said detection circuit is adapted to detect a transition of at least one of the current amplitude signals and, in response thereto, generates an address transition detection (ATD) signal of a voltage amplitude.

35. An address transition detector circuit according to claim 34, wherein said cascode amplifier comprises a multiemitter bipolar transistor having a plurality of emitters in which a voltage at each of the emitters and a base voltage are maintained substantially constant, thereby permitting connection of the emitters with the input circuits.

36. An address transition detector circuit according to claim 34, wherein said cascode amplifier comprises a plurality of bipolar transistors each of which having an emitter voltage and a base voltage maintained substantially constant, thereby permitting connection of the bipolar transistors with the plurality of input circuits.

37. An address transition detector circuit according to claim 34, wherein said cascode amplifier comprises a plurality of field effect transistors each of which having a gate voltage and a source voltage maintained substantially constant, thereby permitting connection of the field effect transistors with the plurality of input circuits.

38. An address transition detector circuit according to claim 34, wherein said cascode amplifier receives the current amplitude signals from the input circuits and generates a voltage in response thereto, and wherein said detection circuit further comprises an emitter-coupled logic (ECL) circuit for generating the ATD signal of a voltage amplitude based on the generated voltage at an output of said cascode amplifier.

39. An address transition detector circuit according to claim 34, wherein said cascode amplifier receives the current amplitude signals from the input circuits and generates a current, and wherein said detection circuit further comprises an emitter-coupled logic (ECL) circuit, coupled to said cascode amplifier, for generating the ATD signal of a voltage amplitude in accordance with the generated voltage.

40. An address transition detector circuit according to claim 34, wherein said cascode amplifier receives the current amplitude signals from the input circuits and converts the current amplitude signal received to a voltage, and wherein said detection circuit further comprises an emitter-coupled logic (ECL) circuit, coupled to said cascode amplifier, for generating the ATD signal of a voltage amplitude in accordance with the converted voltage.

41. An address transition detector circuit according to claim 34, wherein said cascode amplifier receives the current amplitude signals from the input circuits and generates a current, and wherein said detection circuit further comprises an emitter-coupled logic (ECL) circuit for converting the generated current, from said cascode amplifier, to a voltage and generating the ATD signal of a voltage amplitude based on the converted voltage.

42. An address transition detector circuit according to claim 34, wherein said plurality of input circuits are adapted to detect a transition of a leading edge of the address signals applied thereto, respectively.

43. An address transition detector circuit according to claim 34, wherein each of the input circuits comprises a delay circuit and a switching circuit, said delay circuit receiving, at an input thereof, a corresponding address signal of the voltage amplitude and providing, at an output thereof, a delayed logical invert of the address signal, and said switching circuit including (1) a first switching element for receiving the delayed logical invert of the address signal and, in response thereto, controlling a flow of a current, and (2) a second switching element for receiving the corresponding address signal and controlling a flow of a current according to a logical level of the address signal.

44. An address transition detector circuit according to claim 43, further comprising a current limiter circuit for controlling a level of current flow through said switching circuit according to a control signal provided to said current limiter circuit from another circuit.

45. An address transition detector circuit according to claim 43, further comprising a third switching element for receiving a control signal provided from another circuit and controlling a level of current flow through said switching circuit according to the control signal received.

46. An address transition detector circuit according to claim 34, wherein said plurality of input circuits are adapted to detect a transition of a trailing edge of the input signals applied thereto, respectively.

47. An address transition detector circuit according to claim 34, wherein each of the input circuits comprises:

a delay circuit for receiving, at an input thereof, the corresponding address signal of the voltage amplitude and providing at an output thereof, a delayed logical invert of the address signal;

a NOR gate having one input for receiving the address signal, another input for receiving the delayed logical invert of the address signal, and an output for providing a result of a logical NOR operation; and a first switching element coupled to receive the result from the output of said NOR gate and, in response thereto, controlling a flow of a current.

48. An address transition detector circuit according to claim 47, further comprising a current limiter circuit for controlling the flow of a current through said first switching element according to a control signal provided to said current limiter circuit from another circuit.

49. An address transition detector circuit according to claim 47, further comprising a second switching element for receiving a control signal provided from another circuit and controlling the flow of a current through said first switching element according to the control signal.

50. An address transition detector circuit according to claim 34, wherein the output signal of said detection circuit is a single voltage signal.

51. An address transition detector circuit according to claim 34, wherein the output signal of said detection circuit is a differential voltage signal.

* * * * *